(12) United States Patent
Horie et al.

(10) Patent No.: US 9,048,100 B2
(45) Date of Patent: Jun. 2, 2015

(54) NITRIDE SEMICONDUCTOR AND NITRIDE SEMICONDUCTOR CRYSTAL GROWTH METHOD

(75) Inventors: Hideyoshi Horie, Ibaraki (JP); Kaori Kurihara, Ibaraki (JP)

(73) Assignee: Mitsubishi Chemical Corporation, Tokyo (JP)

( * ) Notice: Subject to any disclaimer, the term of this patent is extended or adjusted under 35 U.S.C. 154(b) by 586 days.

(21) Appl. No.: 12/744,076

(22) PCT Filed: Nov. 20, 2008

(86) PCT No.: PCT/JP2008/003423
§ 371 (c)(1),
(2), (4) Date: May 21, 2010

(87) PCT Pub. No.: WO2009/066464
PCT Pub. Date: May 28, 2009

(65) Prior Publication Data
US 2010/0252835 A1    Oct. 7, 2010

(30) Foreign Application Priority Data
Nov. 21, 2007    (JP) .................................. 2007-301555

(51) Int. Cl.
*H01L 21/20*    (2006.01)
*H01L 21/02*    (2006.01)
(Continued)

(52) U.S. Cl.
CPC .......... *H01L 21/02634* (2013.01); *C30B 25/02* (2013.01); *C30B 29/403* (2013.01);
(Continued)

(58) Field of Classification Search
USPC ................ 438/478, 481; 257/E21.098, E21.1
See application file for complete search history.

(56) References Cited

U.S. PATENT DOCUMENTS

2001/0030329 A1    10/2001   Ueta et al.
2002/0022286 A1    2/2002    Nikolaev et al.
(Continued)

FOREIGN PATENT DOCUMENTS

EP    2 221 856 A1    8/2010
JP    2001-57463      2/2001
(Continued)

OTHER PUBLICATIONS

Machine Translation of JP 2006-229253.*
(Continued)

*Primary Examiner* — Julia Slutsker
(74) *Attorney, Agent, or Firm* — Oblon, McClelland, Maier & Neustadt, L.L.P.

(57) ABSTRACT

A base at least one principal plane of which is a nitride is prepared for use in epitaxial growth. The base is placed on a susceptor in an epitaxial growth reactor and heated to a predetermined temperature (step A). The heating is started with inactive, nitrogen gas being supplied into the reactor. Then, active, $NH_3$ gas is supplied. Then, a growth step (step B) of a first nitride semiconductor layer is started without an intervening step of thermally cleaning the principal nitride plane of the base. In step B, the first nitride semiconductor layer is epitaxially grown on a principal nitride plane of a base without supply of an Si source material. Then, a relatively thick, second nitride semiconductor layer is epitaxially grown on the first nitride semiconductor layer by supplying an n-type dopant source material (step C).

11 Claims, 12 Drawing Sheets

(51) Int. Cl.
  *C30B 25/02* (2006.01)
  *C30B 29/40* (2006.01)
  *H01L 33/00* (2010.01)
(52) U.S. Cl.
  CPC ...... *H01L21/0237* (2013.01); *H01L 21/02458* (2013.01); *H01L 21/0254* (2013.01); *H01L 21/0262* (2013.01); *H01L 21/02658* (2013.01); *H01L 33/0075* (2013.01); *H01L 21/02389* (2013.01)
  USPC .................. 438/478; 438/481; 257/E21.098; 257/E21.1

(56) References Cited

U.S. PATENT DOCUMENTS

| | | | |
|---|---|---|---|
| 2005/0173715 A1 | 8/2005 | Kyono et al. | |
| 2006/0189012 A1* | 8/2006 | Ueta et al. | 438/21 |
| 2006/0223287 A1 | 10/2006 | Ushida et al. | |
| 2006/0262823 A1* | 11/2006 | Sugimoto et al. | 372/45.01 |
| 2007/0037308 A1 | 2/2007 | Okuyama et al. | |
| 2007/0241352 A1* | 10/2007 | Yasuda et al. | 257/94 |
| 2007/0254459 A1 | 11/2007 | Lee et al. | |
| 2009/0189186 A1* | 7/2009 | Tanabe et al. | 257/192 |

FOREIGN PATENT DOCUMENTS

| | | |
|---|---|---|
| JP | 2001-322899 | 11/2001 |
| JP | 2002-141613 | 5/2002 |
| JP | 2002-299686 | 10/2002 |
| JP | 2005-136162 | 5/2005 |
| JP | 2005-294644 | 10/2005 |
| JP | 2005 311072 | 11/2005 |
| JP | 2005 347494 | 12/2005 |
| JP | 2006 60069 | 3/2006 |
| JP | 2006 229253 | 8/2006 |
| JP | 2006-310766 | 11/2006 |
| JP | 2007 48869 | 2/2007 |
| JP | 2007 67454 | 3/2007 |
| JP | 2007 290960 | 11/2007 |
| WO | WO 2005/124879 A1 | 12/2005 |

OTHER PUBLICATIONS

U.S. Appl. No. 12/744,163, filed May 21, 2010, Horie, et al.
Office Action issued Jul. 4, 2013, in European Patent Application No. EP20080851532, filed Nov. 20, 2008.
Office Action issued Jul. 9, 2013, in Japanese Patent Application No. JP20080297165, filed Nov. 20, 2008.
Office Action issued Aug. 5, 2014 in Japanese Patent Application No. 2013-177250, filed Aug. 28, 2013.

* cited by examiner (A)

(B)

NITRIDE SEMICONDUCTOR AND NITRIDE SEMICONDUCTOR CRYSTAL GROWTH METHOD

TECHNICAL FIELD

The present invention relates to a nitride semiconductor crystal growth technique, and more particularly, to a crystal growth technique for obtaining a high-quality nitride semiconductor with excellent surface conditions and optical characteristics.

BACKGROUND ART

A blue-color light-emitting element or ultraviolet light-emitting element can be used as a white light source if combined with an appropriate wavelength conversion material. Active studies have been conducted on applications of such white light sources to backlights for liquid crystal displays and the like, light-emitting diode illumination, automotive lighting, general lighting to replace fluorescent lighting, and so on. Some of the studies have already been put to practical use. Today, such blue-color light-emitting elements and ultraviolet light-emitting elements are produced mainly by growing a thin film of gallium nitride-based semiconductor crystal using a technique such as a metal-organic chemical vapor deposition process (MOCVD process) or molecular beam epitaxy process (MBE process) and are collectively referred to as gallium nitride-based light-emitting diodes or GaN-based LEDs.

Conventionally, most of the substrates used for GaN-based LEDs are sapphire substrates. Since sapphire and GaN differ greatly in lattice constant, a considerable dislocation on the order of $10^9/cm^2$ is unavoidable for a GaN crystal epitaxially grown on a sapphire substrate. However, sapphire substrates are more inexpensive than SiC substrates and GaN substrates. Moreover, since light-emitting efficiencies of InGaN in blue-color light-emitting regions normally used as quantum well layers of GaN-based LEDs are insufficiently sensitive to dislocation density, sapphire substrates are still used widely as primary substrates under the present circumstances.

However, when gallium nitride-based semiconductor crystals are viewed as a material for devices used under conditions of high carrier concentration, high dislocation density such as described above considerably deteriorates device characteristics. For example, high dislocation density remarkably reduces the life of devices such as high-power LEDs or lasers. Also, when an active layer structure contains no In such as when an AlGaN layer is used as an active layer, or when an active layer structure includes an InGaN layer or InAlGaN layer with a relatively small In content (e.g., about 0.1 or below) to realize light emission with a wavelength shorter than somewhere around, the near-ultraviolet region, the dependence of internal quantum efficiency on the dislocation density increases, and consequently luminous intensity itself decreases if the dislocation density is high unlike when an InGaN layer with a blue or longer emission wavelength is contained in the active layer structure. For these cases, it is useful to adopt a GaN substrate as a substrate for epitaxial growth. It is expected that this will reduce the dislocation density found in epitaxial layers to $10^8/cm^2$ or below, or even $10^7/cm^2$ or below. Furthermore, if dislocations and the like on the substrate and the like are reduced, the dislocation density is expected to be reduced to even $10^6/cm^2$ or below. That is, the dislocation density is expected to be reduced by two to three orders of magnitude or more compared to when a sapphire substrate is used. In view of these circumstances, freestanding GaN substrates and freestanding AlN substrates are suitable as substrates for epitaxial growth of gallium nitride-based semiconductor crystals.

As attempts to epitaxially grow gallium nitride-based semiconductor crystals on GaN substrates which are nitride substrates, examples on such attempts include Patent Document 1 (Japanese Patent Laid-Open No. 2005-347494), Patent Document 2 (Japanese Patent Laid-Open No. 2005-311072, and Patent Document 3 (Japanese Patent Laid-Open No. 2007-67454).

Patent Document 1 discloses a technique which involves using a nitride substrate ((0001)-plane GaN substrate) to epitaxially grow a GaN layer, cleaning the GaN substrate with a reactor pressure set to 30 kilopascals, growing a 1-μm-thick first n-type GaN buffer layer with the substrate temperature maintained at 1050° C. and the reactor pressure maintained at 30 kilopascals, subsequently stopping raw material supply once, and further forming a 1-μm-thick second n-type GaN buffer layer by heating the substrate to a substrate temperature of 1100° C. with the reactor pressure maintained at 30 kilopascals. This crystal growth method allegedly provides a semiconductor apparatus having buffer layers with excellent surface flatness and good crystal quality.

Patent Document 2 discloses an invention of a light-emitting element produced by removing organic and other contaminations and moisture adhered to the surface of a GaN substrate while improving surface crystallinity of the substrate by flows of hydrogen gas, nitrogen gas, and ammonia gas, forming a multilayer structure intermediate layer made up of GaN and InGaN layers on the GaN substrate using flows of nitrogen gas and hydrogen gas, and then forming a reflective layer, active layer, and gallium nitride-based semiconductor layer on the intermediate layer.

Example 26 in Patent Document 3 discloses an invention of a laser element produced by forming a 3-μm-thick n-type GaN buffer layer doped with Si on a GaN substrate and building a stacked structure on the n-type GaN buffer layer. Incidentally, the Patent Document states that a 300-Angstrom or thinner buffer layer formed at a low temperature of around 500° C. may be provided between the GaN buffer layer and GaN substrate.

Patent Document 1: Japanese Patent Laid-Open No. 2005-347494

Patent Document 2: Japanese Patent Laid-Open No. 2005-311072

Patent Document 3: Japanese Patent Laid-Open No. 2007-67454

DISCLOSURE OF THE INVENTION

Problems to be Solved by the Invention

However, studies conducted by the present inventors have confirmed that with the crystal growth methods described in patent documents 1 to 3, it is relatively difficult to obtain nitride semiconductors with excellent surface flatness and high repeatability and that optical characteristics of resulting films cannot be said to be sufficient.

The present invention has been made in view of the above problems and has an object to provide a crystal growth method for obtaining a high-quality nitride semiconductor which exhibits high luminous efficiency when used as a light-emitting element because of good surface morphology and optical characteristics as well as because of reduced dislocation density.

Means for Solving the Problems

According to a first aspect of the present invention, there is provided a crystal growth method for growing a crystal of a nitride semiconductor on a principal nitride plane of a base at least one principal plane of which is a nitride, the nitride semiconductor crystal growth method comprising: a heating step including a period $t_A$ during which the base is heated to a predetermined temperature with the principal nitride plane of the base exposed to an atmosphere containing an active gas other than hydrogen gas; a first growth step of epitaxially growing a first nitride semiconductor layer on the principal nitride plane of the base with the principal nitride plane of the base exposed to an atmosphere containing an active gas and without intentional supply of a silicon (Si) source material; and a second growth step of epitaxially growing a second nitride semiconductor layer on the first nitride semiconductor layer while supplying an n-type dopant source material with the surface of the first nitride semiconductor layer exposed to an atmosphere containing an active gas.

According to a second aspect of the present invention, there is provided a crystal growth method for growing a crystal of a nitride semiconductor on a principal nitride plane of a base at least one principal plane of which is a nitride, the nitride semiconductor crystal growth method comprising: a heating step including a period $t_A$ during which the base is heated to a predetermined temperature in an atmosphere having a main flow containing an active gas other than hydrogen gas; a first growth step of epitaxially growing a first nitride semiconductor layer on the principal nitride plane of the base in an atmosphere having a main flow containing an active gas and without intentional supply of a silicon (Si) source material; and a second growth step of epitaxially growing a second nitride semiconductor layer on the first nitride semiconductor layer while supplying an n-type dopant source material in an atmosphere having a main flow containing an active gas.

As a result of the above-described crystal growth, according to a first aspect of the present invention, there is provided a nitride semiconductor epitaxially grown on a principal nitride plane of a base at least one principal plane of which is a nitride, characterized in that a nitride semiconductor layer epitaxially grown without intentional supply of an Si source material is provided on the principal nitride plane of the base without interposing any other layer.

According to a second aspect of the present invention, there is provided a nitride semiconductor epitaxially grown on a principal nitride plane of a base at least one principal plane of which is a nitride, comprising a stack of a first nitride semiconductor layer and a second nitride semiconductor layer, characterized in that: a peak value of silicon (Si) concentration in the first nitride semiconductor layer is $1\times10^{21}$ cm$^{-3}$ or below; and that the second nitride semiconductor layer is of an n conductivity type.

According to a third aspect of the present invention, there is provided a nitride semiconductor epitaxially grown on a principal nitride plane of a base at least one principal plane of which is a nitride, comprising a stack of a first nitride semiconductor layer and a second nitride semiconductor layer, characterized in that an outermost surface of the stack has an average surface roughness Ra of 13.0 nm or below.

According to a fourth aspect of the present invention, there is provided a nitride semiconductor epitaxially grown on a principal nitride plane of a base at least one principal plane of which is a nitride, comprising a stack of a first nitride semiconductor layer and a second nitride semiconductor layer, characterized in that an outermost surface of the stack is a crystal plane within ±5 degrees inclusive from a (0001) c+ plane.

According to a fifth aspect of the present invention, there is provided a nitride semiconductor epitaxially grown on a principal nitride plane of a base at least one principal plane of which is a nitride, comprising a stack of a first nitride semiconductor layer and a second nitride semiconductor layer, characterized in that dislocation density of the stack is $1\times10^7$ cm$^{-2}$ or below.

Preferably, the nitride on the principal plane of the base is GaN, AlN, InN, or BN, or a mixed crystal thereof.

Preferably, the nitride on the principal plane of the base is a GaN film, an AlN film, an InN film, or a BN film, or a mixed-crystal film thereof formed by crystal growth on a sapphire substrate, an SiC substrate, a ZnO substrate, an Si substrate, a GaN substrate, an AlN substrate, an InN substrate, or a BN substrate, or a freestanding substrate of a mixed crystal thereof.

Preferably, the base is a freestanding substrate of GaN, AlN, InN, or BN, or a mixed crystal thereof.

Preferably, the principal nitride plane of the base is a crystal plane within ±5 degrees inclusive from a (0001) c+-plane.

Preferably, thickness $L_1$ of the first nitride semiconductor layer is 0.1 nm to 150 nm both inclusive.

The first nitride semiconductor layer is, for example, a III-V group nitride semiconductor of GaN, AlN, InN, or BN, or a mixed crystal thereof.

Preferably, thickness $L_2$ of the second nitride semiconductor layer is 400 nm to 20 µm both inclusive.

Preferably, silicon concentration in the second nitride semiconductor layer is $1\times10^{17}$ cm$^{-3}$ to $6\times10^{19}$ cm$^{-3}$ both inclusive.

The second nitride semiconductor layer is, for example, a III-V group nitride semiconductor of GaN, AlN, InN, or BN, or a mixed crystal thereof.

The nitride semiconductor according to the present invention may comprise a stacked structure including an active layer on the second nitride semiconductor layer, characterized in that the active layer contains In with a composition ratio no less than 0.04 and less than 0.10 and emits light with a wavelength of 400±30 nm.

In that case, preferably dislocation density in the active layer is $1\times10^7$ cm$^{-2}$ or below.

Also, the nitride semiconductor may further comprise a layer containing a dopant capable of making a semiconductor p-type on the stacked structure including an active layer.

In that case, preferably concentration of a dopant element in the layer containing a dopant capable of making a semiconductor p-type is $1\times10^{19}$ cm$^{-3}$ to $8\times10^{19}$ cm$^{-3}$.

For example, the layer containing a dopant capable of making a semiconductor p-type contains one or more elements selected from magnesium, zinc, carbon, and beryllium.

Preferably thickness of the layer containing a dopant capable of making a semiconductor p-type is 0.05 µm to 0.25 µm.

Also, preferably the layer containing a dopant capable of making a semiconductor p-type is made of $Al_xGa_{1-x}N$ ($0 \leq X \leq 1$). In that case, preferably Al composition x in $Al_xGa_{1-x}N$ is 0.02 to 0.20.

According to the present invention, gases which do not have etching effect on nitrides are mainly used as constituent gases of a main flow (atmosphere to which a principal nitride plane of the base is exposed) during a heating step in a relatively high temperature region before nitride semiconductor layers are grown. Also, Si source is not supplied intentionally in an initial growth stage of the nitride semiconductor layers. Consequently, nitrogen atoms are less liable to leave from near the surface of the nitride on the epitaxial base. This prevents defects from being introduced into the epitaxial films and enables epitaxial growth characterized by surface morphology of excellent flatness.

Also, according to the present invention, the thickness of the first nitride semiconductor layer (not intentionally doped with Si) is optimized, where the first nitride semiconductor layer is the initial layer of crystal growth of the nitride semiconductor. This makes it possible to improve crystallinity of the nitride semiconductor epitaxially grown on the (first) nitride semiconductor layer.

Thus, the present invention provides a high-quality nitride semiconductor which exhibits high luminous efficiency when used as a light-emitting element because of good surface morphology and optical characteristics as well as because of reduced dislocation density.

BEST MODE FOR CARRYING OUT THE INVENTION

There are various epitaxial growth methods, among which the present invention can mainly be applied to vapor-phase epitaxy processes, suitably be applied to the H-VPE process (Hydride Vapor Phase Epitaxy) and MOCVD process in particular, and most suitably be applied to the MOCVD process. For example, equipment forms of various configurations can be applied to the MOCVD process, and gases are introduced as required, depending on the equipment form, including gases which make up a main atmosphere during heating or cooling; gases which make up a main atmosphere during growth; source gases; gases used as carriers to realize the supply of organic metals or part of dopants; gases used to dilute raw materials; auxiliary gases used to improve the efficiency of introducing source gases, bringing constituent gases of an atmosphere into contact with a base, and supplying the constituent gases to the base; gases used for flow adjustment such as changing an entire gas flow into a laminar flow; gases used to stabilize components such as a heater and various ports and extend the life of the components; and gases introduced to purge the reactor.

Among flows of the gases described above, the flow of the auxiliary gases used to improve the efficiency of introducing source gases to a base, bringing constituent gases of an atmosphere into contact with the base, and supplying the constituent gases to the base as well as the flow of gases used for flow adjustment such as changing an entire gas flow into a laminar flow will be referred to hereinafter as "subflows" for the sake of convenience. Also, flows of gases which do not directly contribute to epitaxial growth, including gases used to stabilize components such as a heater and various ports and extend the life of the components and gases introduced to purge the reactor will be referred to as "non-growth-related flows" for the sake of convenience.

On the other hand, all the gas flows except the subflows supplied to the crystal growth equipment and non-growth-related flows will be referred to hereinafter as a "main flow" for the sake of convenience. Thus, the main flow is a general term principally for flows of gases which make up a main atmosphere during heating or cooling, gases which make up a main atmosphere during growth, source gases, gases used as carriers to realize the supply of organic metals or part of dopants, and gases used to dilute raw materials. Practically, the main flow is the atmosphere itself to which the surface of the base used for epitaxial growth of a nitride semiconductor and the epitaxially growing crystal surface of the nitride semiconductor are exposed. Thus, the main flow is indispensable for vapor-phase growth while the subflows and non-growth-related flows are optional.

Figure 1:
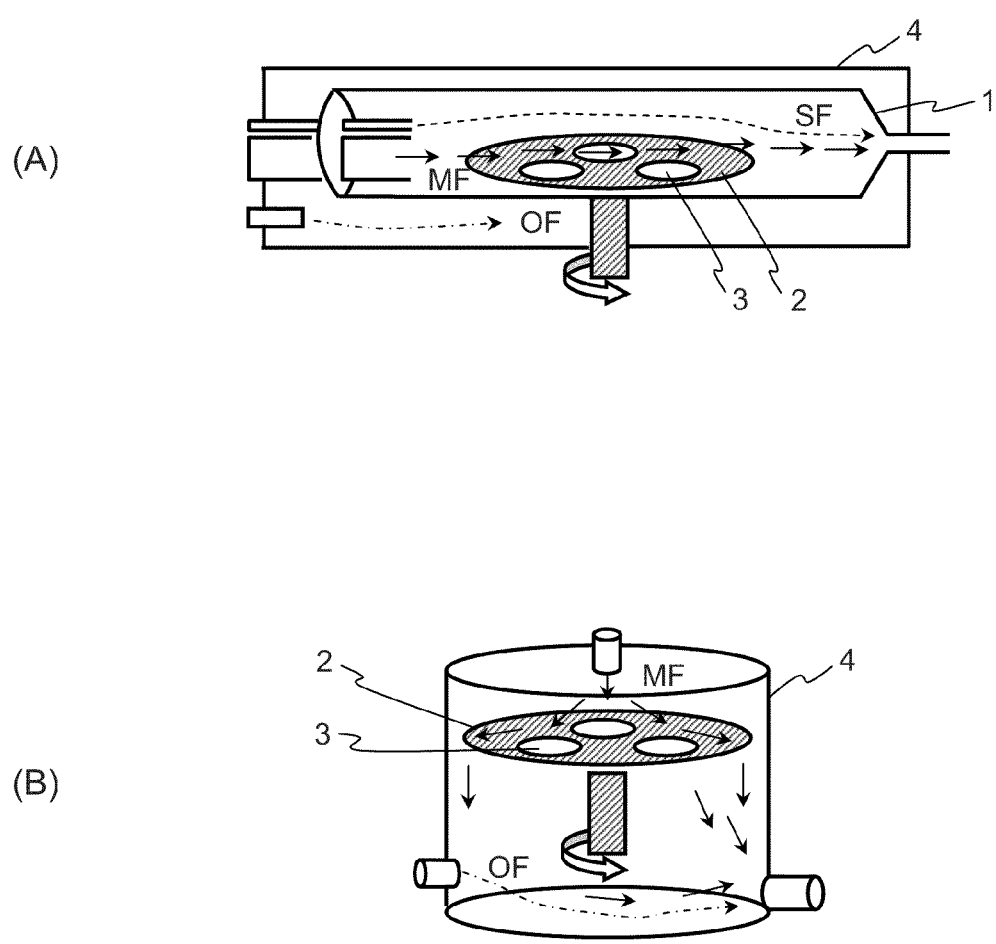
FIGS. 1(A) and 1(B) are diagrams for conceptually illustrating movement of a main flow in a horizontal MOCVD reactor and vertical MOCVD reactor, respectively, by way of example.

FIGS. 1(A) and 1(B) illustrate examples of a horizontal MOCVD reactor and vertical MOCVD reactor, respectively, and conceptually show movement of a main flow therein. For example, the horizontal reactor (FIG. 1(A)) is configured such that a surface of a base 3 placed on a susceptor 2 housed in a quartz reaction vessel 1 will be exposed to a main flow MF, which constitutes a practical "atmosphere" for the base 3. The main flow MF is pressed against the surface of the base 3 by a subflow SF. This improves the efficiency of introducing source gases to the base 3, bringing constituent gases of the atmosphere into contact with the base 3, and supplying the constituent gases to the base 3 and changes the entire gas flow into a laminar flow.

In the configuration in FIG. 1(B) which shows an example of the vertical reactor, no subflow gas is supplied, and the gases which flow in the quartz reaction vessel 1 are only the constituent gases of the main flow MF. Incidentally, in both the horizontal reactor (FIG. 1(A)) and vertical reactor (FIG. 1(B)), a gas flow, i.e., a non-growth-related flow OF, is produced by gas supply for heater purge and viewport purge.

Furthermore, a flow mainly containing a gas which provides a nitrogen source material or a flow which forms an atmosphere used to prevent nitrogen from escaping from the surface of the base and epitaxial layers during the epitaxial growth period of the nitride semiconductor including a heating period and cooling period may be referred to hereinafter as a "first main flow" for the sake of convenience. In that case, the gas flow mainly used to supply other raw materials or form other atmospheres may be referred to as a "second main flow" for the sake of convenience. Furthermore, since some of the constituent gases of the main flow can be used as a carrier gas to supply metal-organic materials, part of the constituent gases may be referred to as a carrier gas.

"Active gases" as referred to herein are gases which, being introduced as major constituent gases of the main flow, can produce reactive hydrogen species such as atomic or molecular hydrogen radicals, atomic or molecular hydrogen ions, or atomic hydrogen by decomposing or reacting under temperature and pressure conditions in a series of epitaxial crystal growth steps including a heating, cooling, waiting, and growth steps. Regarding quantity, the active gases exceed 1% of the constituent gases of the main flow in terms of flow ratio during a period of at least any of the epitaxial growth steps.

Thus, examples of major active gases include hydrogen ($H_2$) gas and ammonia ($NH_3$) gas (and a mixture thereof). These gases have etching effect on nitride crystals. In particular, $H_2$ gas has a very high etching effect. Therefore, if surfaces of nitride crystals are exposed to these gases (especially $H_2$ gas) under inappropriate conditions, nitrogen tends to be easily removed from the surfaces of the nitride and atomic-level defects tend to be introduced easily.

On the other hand, "inactive gases" are gases which, being introduced as major constituent gases of the main flow, do not produce reactive hydrogen species in the series of epitaxial crystal growth steps including the heating, cooling, waiting, and growth steps. Regarding quantity, the inactive gases exceed 1% of the constituent gases of the main flow in terms of flow ratio during a period of at least any of the epitaxial growth steps.

Major examples of such inactive gases include nitrogen ($N_2$), helium (He), argon (Ar), xenon (Xe), and krypton (Kr). Also, inactive gases include acetonitrile; azoisobutane; hydrazine compounds such as 1,1-dimethyl hydrazine; amine compounds such as dimethylamine, diethylamine, trimethylamine, triethylamine, triallylamine, and tri-isobutylamine; and azide compounds such as methyl azide, ethyl azide, phenyl azide, diethylaluminum azide, diethylgallium azide, and tris-dimethylamino antimony as well as mixtures thereof because these compounds satisfy the conditions of inactive gases.

Since hydrogen gas has etching effect on nitrides as described above, according to the present invention, the atmosphere is controlled so that the surface of the base will not be exposed excessively to active, $H_2$ gas during the heating step.

Figure 2A:
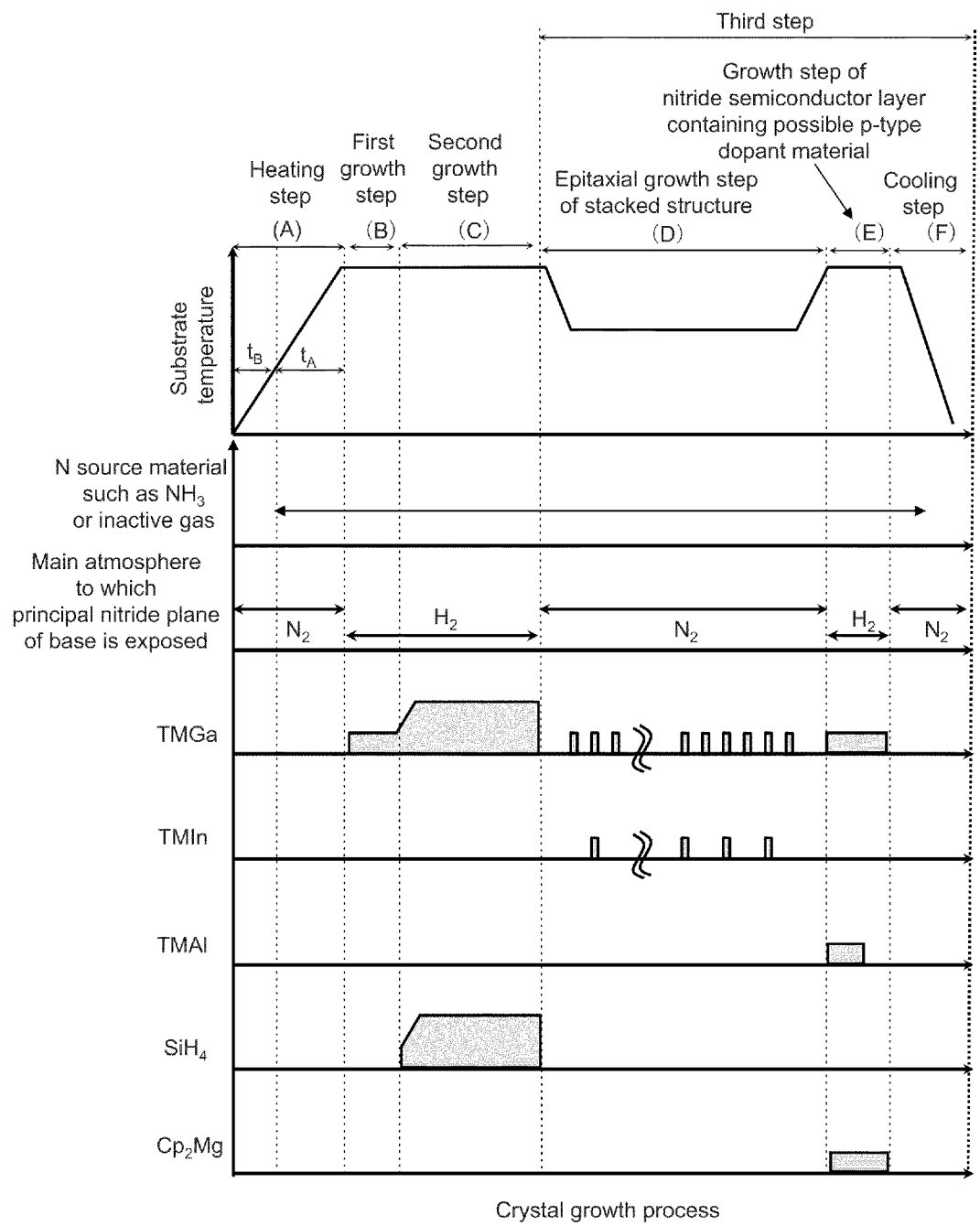
FIG. 2(A) is a diagram for illustrating an exemplary sequence of a nitride semiconductor crystal growth method according to the present invention.

FIG. 2(A) is a diagram for illustrating an exemplary sequence of a nitride semiconductor crystal growth method according to the present invention, and shows an example in which a GaN film is epitaxially grown on a freestanding GaN substrate whose principal plane is the (0001) plane. The reactor used for epitaxial growth is, for example, a metal-organic vapor-phase epitaxy apparatus, examples of which include three-flow quartz reactor with horizontal laminar flow which normally operates under conditions of normal pressure, planetary reactor which normally operates under conditions of reduced pressure, and a vertical stainless steel reactor which normally operates under conditions of reduced pressure.

First, a base at least one principal plane of which is a nitride is prepared for use in epitaxial growth. The base is placed on a susceptor in the reactor for epitaxial growth and heated to a predetermined temperature (step A). The nitride on the principal plane of the base is GaN, AlN, InN, or BN, or a freestanding substrate of a mixed crystal thereof. Alternatively, the nitride on the principal plane of the base is a GaN film, an AlN film, an InN film, or a BN film, or a mixed-crystal film thereof formed by crystal growth on a sapphire substrate, an SiC substrate, a ZnO substrate, an Si substrate, a GaN substrate, an AlN substrate, an InN substrate, or a BN substrate, or a freestanding substrate of a mixed crystal thereof.

According to studies conducted by the present inventors, the crystal growth method according to the present invention is suitable for epitaxial growth on a base whose principal plane is a (0001)-plane, (1-102)-plane, (11-20)-plane, or (1-100)-plane, or an equivalent plane, or a plane intermediate therebetween, in terms of crystal plane orientation. In order to epitaxially grow a high-quality nitride semiconductor crystal on a base effectively by the present invention, desirably a so-called OFF angle from a given plane is within ±5.0 degrees inclusive, more desirably within ±3.0 degrees inclusive, still more desirably within ±1.0 degree inclusive, and most desirably within ±0.5 degrees inclusive.

The crystal growth method according to the present invention is especially effective in epitaxially growing a high-quality nitride semiconductor crystal on a surface of a nitride whose principal plane is a polar, c-plane (especially, the (0001)-plane, i.e., c+ plane, which is a gallium surface). For example, a high-quality epitaxially grown film is obtained when a crystal of a GaN-based nitride semiconductor is grown on a freestanding GaN substrate whose principal plane is the (0001)-plane.

Incidentally, even when a c+ plane base is used, the principal plane of the base is a crystal plane whose tilt angles from the precise c+ plane both in M-axis and A-axis directions are desirably within ±5.0 degrees inclusive, more desirably within ±3.0 degrees inclusive, still more desirably within ±1.0 degree inclusive, and most desirably within ±0.5 degrees inclusive.

The heating in step A is intended to heat the base to a temperature of 700° C. to 1,350° C., which is a growth temperature of a first nitride semiconductor layer (described later) and is done, for example, by supplying the constituent gases of the main flow so as to set the pressure in the reactor to 35 kilopascals to 120 kilopascals. In forming a stacked structure such as described later on the nitride semiconductor layer, to improve optical characteristics of the stacked structure which govern optical device characteristics, preferably an attainable heating temperature $T_A$ in step A is in the range of 700° C. to 1,350° C., more preferably in the range of 750° C. to 1,200° C., still more preferably in the range of 900° C. to 1,100° C., and most preferably in the range of 940° C. to 1080° C. Preferably the attainable heating temperature range in step A coincides with a subsequent film formation temperature range of the nitride semiconductor layers. For example, when the film formation of the nitride semiconductor layers is carried out in the temperature range of 940° C. to 1,080° C., the attainable heating temperature in step A also ranges from 940° C. to 1,080° C. Most preferably, the attainable heating temperature is the same as a film formation temperature such as described later.

The heating step shown in FIG. 2(A) by way of example includes two stages: a heating stage (high-temperature stage) which lasts for a period $t_A$, and a heating stage (low-temperature stage) which takes place before the period $t_A$ and lasts for a period $t_B$. In the heating stage (high-temperature stage), the base is heated to a predetermined temperature in an atmosphere with a main flow containing an active gas other than hydrogen gas. In the heating stage (low-temperature stage), the base is heated in a relatively low temperature region in an atmosphere with a main flow containing constituent gases different from those contained in the main flow used during the heating period $t_A$. Hereinafter, the heating stage (low-temperature stage) in the period $t_B$ may be referred to as a "first heating step" for the sake of convenience and the heating stage (high-temperature stage) in the period $t_A$ may be referred to as a "second heating step" for the sake of convenience.

Of the gases shown in FIG. 2(A) by way of example, $NH_3$ gas can be a source gas for the nitrogen of the nitride semiconductor layer. Thus, the main flow in first and second growth steps (described later) includes at least a first main flow and a second main flow, where the first main flow mainly contains a nitrogen source gas ($NH_3$ gas shown in FIG. 2(A) by way of example) while the second main flow mainly contains a gas (any of the gases other than $NH_3$ shown in FIG. 2(A) by way of example) which serves as a source of elements other than the nitrogen of the nitride semiconductor layer.

In the heating stage, which takes place in a relatively low temperature region during the period $t_B$, there is no need to actively reduce nitrogen removal from the nitride on the principal plane of the base. In the heating stage which takes place in a relatively high temperature region during the period $t_A$, it is necessary to actively reduce nitrogen removal from the nitride on the principal plane of the base.

Although this depends on the pressure in the reactor where the base is placed, it is considered to be necessary to actively reduce nitrogen removal from nitride surfaces in temperature regions above about 550° C. Thus, in regions below this temperature, the main flow may contain active and inactive gases in any proportion as constituent gases. For example, the main flow may be made up entirely of inactive, $N_2$ gas, or made up only of active, $NH_3$ gas. In the example shown in FIG. 2(A), the main flow is made up solely of inactive, $N_2$ gas.

The heating stage (high-temperature stage) which takes place in the period $t_A$ and in which the base is heated to a predetermined temperature in an atmosphere of a main flow containing an active gas other than hydrogen gas is very important in order to actively reduce nitrogen removal from nitride surfaces. Incidentally, the base may be heated in the above-described atmosphere throughout the entire heating step. In that case, the period $t_A$ coincides with the period of the heating step.

In the heating stage (high-temperature stage) in the period $t_A$, the main flow is made up of gasses including an active gas other than hydrogen gas. Thus, the base is being heated with the principal nitride plane of the base exposed to an atmosphere containing an active gas other than hydrogen.

Preferably the pressure in the reactor during the heating step is adjusted to be 35 kilopascals to 120 kilopascals. The reason why the lower limit of the pressure in the reactor is set to 35 kilopascals is that optical characteristics will be degraded greatly if the atmosphere to which the surface of the base is exposed has its pressure reduced excessively. This will be described later. Also, as shown in FIG. 2(A), in the heating stage, it is preferable to supply an inactive gas ($N_2$ in this case) simultaneously, in addition to supplying active, $NH_3$ gas as a constituent gas of the main flow.

If a stacked structure such as described later is formed on the nitride semiconductor layers, to improve the optical characteristics of the stacked structure which govern optical device characteristics, preferably film formation temperatures of the first and second nitride semiconductor layers are in the range of 700° C. to 1,350° C., more preferably in the range of 750° C. to 1,200° C., still more preferably in the range of 900° C. to 1,100° C., and most preferably in the range of 940° C. to 1080° C. Thus, when the film formation of the nitride semiconductor layers is carried out in the temperature range of 940° C. to 1,080° C., the attainable heating temperature in step A also ranges from 940° C. to 1,080° C. Also, it is most preferable that the attainable heating temperature is equal to the film formation temperature.

In the exemplary sequence shown in FIG. 2(A), the first heating step is started by supplying nitrogen gas constituting the second main flow in the reactor, where the nitrogen gas is an inactive gas. When the temperature of the base reaches 500° C., the second heating step is started by adding active, $NH_3$ gas as a constituent gas of the first main flow. The base is further heated in the gas mixture to the target temperature of 1,000° C. The $NH_3$ gas supply in the second heating step is intended to prevent nitrogen from escaping from the surface of the base during the heating step and thereby prevent the crystallinity of the epitaxial growth surface from being reduced.

In the second heating step, preferably the flow ratio (Fp) of the inactive gas component (nitrogen gas) to all the constituent gases of the main flow (in this case, the sum of the first main flow and second main flow) is from 0.5 to 1.0 (both inclusive), more preferably 0.7 to 1.0 (both inclusive), and still more preferably 0.8 to 1.0. These gas mixture components are used because if an excessive amount of active gas is contained in the atmosphere to which the surface of the base is exposed during heating of the base in a relatively high temperature region, defects tend to be introduced easily to the nitride crystal on the surface of the base.

The heating step (step A) is followed by a growth step (step B) of the first nitride semiconductor layer, in which the present invention can epitaxially grow high-quality nitride semiconductor layers even if a thermal cleaning step such as adopted by conventional crystal growth methods is not used to clean the principal nitride plane of the base. Especially when the principal nitride plane of the base is the polar plane, in particular c+-plane, good crystal morphology is obtained without such a cleaning step.

In step B, while $NH_3$ gas is continued to be supplied as the constituent gas of the first main flow, nitrogen gas is replaced with hydrogen gas as the constituent gas of the second main flow. After the reactor atmosphere is stabilized, part of the gas which is the constituent gas of the second main flow is used as a carrier gas to supply source materials for III group elements and dopants. Then, raw materials for epitaxial growth is supplied to the reactor to initiate crystal growth of the nitride semiconductor layer.

In the exemplary sequence shown in FIG. 2(A), $NH_3$ gas which can be a nitrogen source material of GaN is supplied as a constituent gas of the first main flow, part of the constituent gas of the second main flow is used as a carrier gas, and a source material for trimethylgallium (TMGa) is supplied as a gallium source. Preferably the first nitride semiconductor layer is a crystal which does not contain polycrystalline components, and more preferably is made of a single crystal itself. A second nitride semiconductor layer is formed further on the first nitride semiconductor layer. Of course, a nitride semiconductor layer may be formed further on the second nitride semiconductor layer.

In step B, the first nitride semiconductor layer is epitaxially grown in an environment in which no silicon (Si) source material is intentionally supplied to the principal nitride plane of the base. That is, the first nitride semiconductor layer is epitaxially grown on the principal nitride plane of the base with the principal nitride plane of the base exposed to an atmosphere containing an active gas, and without intentional supply of an Si source material. In the case of the sequence shown in FIG. 2(A), this means that in the atmosphere containing an active gas and making up the main flow, the first nitride semiconductor layer is epitaxially grown on the principal nitride plane of the base without intentional supply of an Si source material.

A typical film thus obtained is generally an i-GaN layer. Where the i-GaN layer means a GaN layer which is epitaxially grown without intentional supply of a source material for a dopant such as Si, it is generally the case that Si and the like get mixed in the film from impurities contained in a source gas or from quartz components existing in or near the reactor. Furthermore, for example, if an Si-based abrasive used in a polishing step of a freestanding substrate such as a GaN substrate or AlN substrate attaches as a residue to the surface of the base, Si remaining on the surface of the base during epitaxial growth may get mixed as an impurity in the i-GaN layer. In addition, when a freestanding substrate such as a GaN substrate or AlN substrate intentionally doped with Si during its fabrication is used for epitaxial growth, Si segregation may occur on the substrate surface during epitaxial growth and the Si may be taken into the i-GaN layer.

Preferably the concentration of such an unintended impurity is kept to or below $3\times10^{17}$ cm$^{-3}$ in the case of Si. An unavoidably added impurity such as described above may be unevenly distributed near the GaN layer, for example, due to a pile-up phenomenon or the like and, as a result, taken into the GaN layer at a concentration in excess of $3\times10^{17}$ cm$^{-3}$ described above. However, in studies conducted by the present inventors, noticeable deterioration in film quality of the GaN layer was not observed unless impurities were taken into the GaN layer as a result of intentional raw material supply, as shown later in examples and comparative examples. Thus, any mention made of "Si concentration on nitride semiconductor layer" herein refers to Si taken into the layer through intentional raw material supply such as SiH$_4$ or Si$_2$H$_6$ supply unless specifically noted.

Even when Si is unavoidably mixed in the GaN layer due to the pile-up phenomenon or the like described above, preferably a peak value of the impurity concentration (Si concentration) in the first nitride semiconductor layer is kept to or below $1\times10^{21}$ cm$^{-3}$. More preferably the impurity concentration (Si concentration) is kept to or below $1\times10^{20}$ cm$^{-1}$, still more preferably to or below $8\times10^{19}$ cm$^{-3}$, and most preferably to or below $6\times10^{19}$ cm$^{-3}$. A thick-film GaN layer with an Si concentration in excess of $6\times10^{19}$ cm$^{-3}$ can have a problem with its surface flatness although such a problem is not noticeable in a thin-film layer. Thus, it is most preferable to keep the Si concentration to or below $6\times10^{19}$ cm$^{-3}$ even in the case of a thin-film layer.

Also, preferably average Si concentration in a thickness direction of the grown film in the first nitride semiconductor layer is lower than average Si concentration in a thickness direction of the grown film in the second nitride semiconductor layer. This is because even if Si is mixed in due to any of the causes described above, since the impact of Si is considered to reach only as deep as approximately a few hundred nm from an interface, if the first nitride semiconductor layer is sufficiently thicker than this figure, the average Si concentration in the thickness direction of the grown film in the first nitride semiconductor layer epitaxially grown without intentional supply of a source material for a dopant such as Si is considered to become lower than the Si concentration in the second nitride semiconductor layer grown by intentionally adding Si as an n-type dopant.

However, when a first nitride semiconductor layer approximately a few hundred nm or below in thickness is formed on a base used for epitaxial growth, even if the first nitride semiconductor layer is epitaxially grown without intentional supply of a source material for a dopant such as Si, the average Si concentration in the thickness direction of the grown film in the first nitride semiconductor layer may become higher than the Si concentration in the second nitride semiconductor layer grown by intentionally adding Si as an n-type dopant.

In this case, the Si concentration in the second nitride semiconductor layer is considered to be lower than the Si concentration in the first nitride semiconductor layer estimated on the assumption that the pile-up phenomenon does not occur. In view of this, it is preferable that the Si concentration in the second nitride semiconductor layer is $1\times10^{17}$ cm$^{-3}$.

In step B, preferably with the reactor pressure also set, for example, between about 35 kilopascals and 120 kilopascals, gases are supplied such that the component ratio of active gas to all the constituent gases of the main flow will be between 0.5 and 1.0 (both inclusive), and more preferably between 0.8 and 1.0 (both inclusive) (where the component ratio is the flow ratio Fa of the active gas component to the total sum of an NH$_3$ gas component in the first main flow and hydrogen gas and TMGa components in the second main flow in the exemplary sequence shown in FIG. 2(A)).

Since the amount of TMGa is infinitesimal compared to H$_2$ gas and NH$_3$ gas, the flow ratio Fa of active gas component is almost 1.0 in the example of FIG. 2(A). If the flow ratio Fa is less than 0.5, it becomes difficult to grow a flat crystal and consequently the surface of the nitride semiconductor layer tends to become irregular. Also, if epitaxial growth is carried out with the reactor pressure reduced to below 35 kilopascals, crystallinity will be reduced, causing deterioration in photoluminescence (PL) characteristics. On the other hand, if the reactor pressure is 120 kilopascals or above, vapor phase reactions in the reactor will increase, causing carbon to be taken into nitride semiconductor layers during epitaxial growth and resulting in reduced crystallinity.

In step B, the temperature of the base is set to a predetermined temperature in the temperature range of 700° C. to 1,350° C. The lower limit of 700° C. has been determined with consideration given to the heat energy needed for crystal growth of high-quality nitride semiconductors and the upper limit of 1,350° C. has been determined because of constraints such as deterioration of reactor's structural members. If a film is formed at temperatures below 700° C., polycrystalline components tend to bet mixed, resulting in deterioration of light emission characteristics.

Preferably the first nitride semiconductor layer obtained under these conditions is a relatively thin layer with its thickness $L_1$ in the range of 0.1 nm to 150 nm. The reason why the lower thickness limit of the first nitride semiconductor layer is set to 0.1 nm is that at least 0.1 nm is required in order to cover the surface of the base (surface of the nitride) with an epitaxial layer. According to studies conducted by the present inventors, if a second nitride semiconductor layer is homoepitaxially grown on such a first nitride semiconductor layer, it is possible to reduce defects in the second nitride semiconductor layer.

The second nitride semiconductor layer (second GaN layer) which is a relatively thick layer is epitaxially grown (step C) by intentionally supplying an n-type dopant source material onto the first nitride semiconductor layer (first GaN layer). In this step, the second nitride semiconductor layer is epitaxially grown by intentionally supplying an n-type dopant source material onto the first nitride semiconductor layer with the surface of the first nitride semiconductor layer exposed to an atmosphere containing an active gas. In the case of the sequence shown in FIG. 2(A), the second nitride semiconductor layer is epitaxially grown by intentionally supplying an n-type dopant source material onto the first nitride semiconductor layer in an atmosphere containing $N_2$ and $NH_3$ gases and making up the main flow. Examples of possible n-type dopants in nitride semiconductor layers include Si, O, C, Ge, Se, S, and T, of which Si, Se, and O are especially suitable and Si is the most suitable.

In step C, again the temperature of the base is set between 700° C. and 1,350° C., but the pressure in the reactor is 5 kilopascals or above and equal to or lower than the pressure used for the epitaxial growth of the first nitride semiconductor layer. In the process of laminating the second nitride semiconductor layer onto the first nitride semiconductor layer, generation of point defects is suppressed. Consequently, the pressure in the reactor can be set lower than in step A and step B. However, at a pressure lower than 5 kilopascals, nitrogen tends to escape from the surface of the second nitride semiconductor layer in the process of growth. Thus, preferably the lower pressure limit is 5 kilopascals.

In the exemplary sequence shown in FIG. 2(A), $NH_3$ gas which can serve as a nitrogen source for GaN is supplied as the first main flow of the main flow and $N_2$ is supplied as the second main flow of the main flow. Part of $N_2$ is used as a carrier gas to supply TMGa as well as to supply silane ($SiH_4$) gas as a source of Si which is an n-type dopant.

In step C, as in the case of step B, preferably gases are supplied such that the flow ratio Fa of the active gas component to all the constituent gases of the main flow will be between 0.5 and 1.0 (both inclusive), and more preferably between 0.8 and 1.0 (both inclusive) (where the flow ratio is that of the active gas component to the total sum of the $NH_3$ gas component in the first main flow and hydrogen gas, TMGa, and $SiH_4$ gas components in the second main flow in the exemplary sequence shown in FIG. 2(A)). Since the amounts of TMGa and $SiH_4$ are infinitesimal compared to $NH_3$ gas and $H_2$ gas, Fa is almost 1.0 again in step C in FIG. 2(A). If Fa is less than 0.5, it becomes difficult to grow a flat crystal and consequently the surface of the nitride semiconductor layer tends to become irregular.

The second nitride semiconductor layer thus obtained is a relatively thick layer with its thickness $L_2$ in the range of 0.4 to 20 μm. Normally the Si concentration is $1 \times 10^{17}$ $cm^{-3}$ or above, preferably $5 \times 10^{17}$ $cm^{-3}$ or above, more preferably $1 \times 10^{18}$ $cm^{-3}$ or above, and particularly preferably $3 \times 10^{18}$ $cm^{-3}$ or above. Also, normally the Si concentration is not higher than $6 \times 10^{19}$ $cm^{-3}$, preferably not higher than $4 \times 10^{19}$ $cm^{-3}$, more preferably not higher than $1 \times 10^{19}$ $cm^{-3}$, and particularly preferably not higher than $7 \times 10^{18}$ $cm^{-3}$.

If the thickness $L_2$ of the second nitride semiconductor layer is below 0.4 μm, it is difficult to obtain good p-n characteristics when a p-n junction device is fabricated. On the other hand, a film thickness in excess of 20 μm tends to cause surface roughness.

Preferably thickness $L_2$ is 0.4 μm (400 nm) or above from the standpoints of making it easier to stabilize electrical characteristics of a fabricated device and lessening adverse effects of slight lattice defects remaining at an epitaxial growth interface on the active layer structure or the quantum well active layer structure of the device. Also, if the dopant concentration is below $1 \times 10^{17}$ $cm^{-3}$, it is difficult to obtain good p-n characteristics when a p-n junction device is fabricated. On the other hand, a dopant concentration in excess of $6 \times 10^{19}$ $cm^{-3}$ tends to cause surface roughness on the nitride semiconductor layers with high dopant concentration.

The present invention includes steps A, B, and C described above, and needless to say, additional steps may be provided. For example, a step of forming a layer structure by repeatedly laminating two or more types of layer with different doping concentrations or two or more types of nitride semiconductor layer made of different materials may be added between steps B and C (between the first nitride semiconductor layer and second nitride semiconductor layer).

As shown in FIG. 2(A) by way of example, a third step may be provided, including a step of epitaxially growing a stacked structure including an MQW layer further on the second nitride semiconductor layer (step D), a step of epitaxially growing nitride semiconductor layer containing p-type dopant (step E), or a cooling step (F).

In the step of epitaxially growing a stacked structure including an MQW layer on the second nitride semiconductor layer (step D), preferably, the stacked structure including the MQW layer is epitaxially grown on the second nitride semiconductor layer with the surface of the second nitride semiconductor layer exposed to an atmosphere containing an inactive gas.

In the case of the sequence shown in FIG. 2(A), a multi-quantum well active layer structure made up of a stacked structure of an InGaN layer and GaN layer is formed on the nitride semiconductor layer in an atmosphere containing $N_2$ and an appropriate amount of $NH_3$ gas and making up the main flow, where $N_2$ is an inactive gas and $NH_3$ is an optional, active gas serving as a nitrogen source material.

Preferably quantum well layers in the multi-quantum well active layer structure according to the present invention contain In, Al, or the like, and most preferably In, to select an emission wavelength as required. Indium concentration in an InGaN quantum well layer is, for example, 0.04 to 0.15 in terms of composition ratio. Preferably an InGaN/GaN multi-quantum well active layer structure emits light with a center wavelength of 400±30 nm (i.e., 370 nm to 430 nm both inclusive).

More preferably the center wavelength is 380 nm to 420 nm both inclusive, which corresponds to about 0.05 to 0.09 in terms of In composition ratio of the InGaN quantum well layer. In addition, most preferably the center wavelength is 395 nm to 415 nm both inclusive, which corresponds to about 0.06 to 0.08 in terms of In composition ratio of the InGaN quantum well layer. Reasons for this are as follows.

Generally, in an InGaN/GaN multi-quantum well active layer structure formed on a c-plane sapphire substrate, a large number of dislocations due to inconsistency of lattice constants and the like propagate from an interface between the sapphire substrate and a GaN-based epitaxial layer to the entire epitaxial layer including the multi-quantum well active layer structure. It is known that such dislocation density is on the order of $1 \times 10^9$ $cm^{-2}$. It is also known that even if an epitaxial layer is formed on a sapphire substrate on which projections and depressions are formed to reduce some of the dislocations, the dislocation density can be reduced only to about $3 \times 10^8$ $cm^{-2}$.

In this case, it is believed that in the quantum well layers, even if there are a large number of dislocations, indium has a localization effect on electron-hole pairs, causing localization of radiative recombination and thereby reducing non-radiative recombination which can occur when electron-hole pairs injected or generated in the quantum well layers are captured by the dislocations and the like. On the other hand, the present invention is preferably applied to homoepitaxial growth on a nitride substrate. That is, since the epitaxial layers of a nitride semiconductor produced by the method according to the present invention have successfully overcome various conventional difficulties with heteroepitaxial growth on a sapphire substrate and the like as well as poor morphology and the like resulting from conventional homoepitaxial growth on a GaN substrate and the like, the dislocation density in the epitaxial layer is very low.

Experiments conducted by the present inventors have shown that the dislocation density in the epitaxial layer according to the present invention is preferably $1 \times 10^7$ (cm$^{-2}$) or below, more preferably $6.5 \times 10^6$ (cm$^{-2}$) or below, and still more preferably $3.0 \times 10^6$ (cm$^{-2}$). Consequently, even if the localization effect of In is limited, the present invention provides good light emission characteristics. Specifically, it has been confirmed that very good light emission characteristics are exhibited even when the In composition ratio of the InGaN quantum well layer is as low as, for example, 0.04 to 0.10.

Thus, the light emitted by the nitride semiconductor epitaxial layer according to the present invention has a center wavelength whose lower limit is preferably 370 nm or above, and more preferably 380 nm or above, and whose upper limit is preferably 430 or below, and more preferably 420 nm or below. The lower limit of the preferable range of in composition (described above) is defined by the minimum In composition of the InGaN layer required to form band offsets with the GaN layer while the upper limit of the preferable range is defined by a range below which internal stresses of InGaN quantum well layers suitably used in the present invention (described later) will not be excessive considering the thickness of the InGaN quantum well layers.

Preferable temperatures of the base in forming a quantum well active layer are defined for the purpose of forming an InGaN layer in a stable manner. Since indium in the InGaN layer has a high vapor pressure, preferably the quantum well active layer is formed at temperatures lower than other layers. In particular, according to studies conducted by the present inventors, it has also been found that flat quantum well active layers with better optical characteristics have a smaller number of microscopic kink sites which are in the process of growth, causing less opportunities for indium to be taken in, and thus tend to have a relatively long wavelength. Thus, when a quantum well active layer structure including an InGaN layer is formed on an epitaxial layer on a flat polar-plane as in the case of the present invention, it is preferable to use a temperature range of 600° C. to 850° C.

Temperatures of the base 600° C. or below are not preferably because the efficiency of decomposing nitrogen source materials is reduced and more impurities are taken in, resulting in deteriorated crystallinity. On the other hand, temperatures above 850° C. intensify re-evaporation of indium atoms, making it difficult to control emission wavelengths and to ensure in-plane uniformity, both of which are dependent on the indium composition. Therefore, it is preferable to set the temperature of the base between 600° C. and 850° C. during formation of a quantum well active layer. When impurities need to be reduced and a higher wavelength repeatability is required, it is more preferable to set the temperature of the base between 700° C. and 800° C. It is most preferable to set the temperature between 720° C. and 790° C.

Preferably the pressure in the reactor during formation of a quantum well active layer is equal to or higher than the pressure during epitaxial growth of the first nitride semiconductor layer, but not above 120 kPa.

This is based on the following reasons. In the step of laminating a quantum well active layer onto the second nitride semiconductor layer, it is necessary to reduce generation of defects in the presence of indium which is an element with high vapor pressure. Thus, it is preferable to set the pressure in the reactor higher than in step B. This makes it possible to appropriately prevent excessive re-evaporation and the like of indium which is an element with high vapor pressure. However, pressures higher than 120 kilopascals will increase vapor phase reactions in the reactor, making it easier for carbon to be taken into the nitride semiconductor layer during epitaxial growth, resulting in reduced crystallinity. Thus, it is preferable that the pressure in the reactor is equal to or higher than the pressure during epitaxial growth of the first nitride semiconductor layer, but not above 120 kPa.

In the exemplary sequence shown in FIG. 2(A), NH$_3$ gas which can serve as a nitrogen source for InGaN and GaN is supplied as the first main flow of the main flow and N$_2$ is supplied as the second main flow of the main, flow. Part of N$_2$ is used as a carrier gas to supply TMGa and TMIn. In step D, preferably gases are supplied such that the component ratio of the inactive gas to all the constituent gases of the main flow will be between 0.5 and 1.0 (both inclusive) in terms of flow ratio (where the component ratio is that of the active gas to the total sum of NH$_3$ gas in the first main flow and nitrogen gas, TMIn, and TMGa in the second main flow in the case of quantum well layers contained in the active layer structure, and that of the inactive gas to the total sum of NH$_3$ gas in the first main flow and nitrogen gas and TMGa in the second main flow in the case of barrier layers contained in the active layer structure, in the exemplary sequence shown in FIG. 2(A)). In particular, in the case of the quantum well layers contained in the active layer structure, preferably H$_2$ is not supplied.

This is because introduction of an excessively active gas—especially introduction of H$_2$ gas which has a high etching effect—extremely impairs flatness of materials, such as InGaN, containing InN, in particular, and consequently reduces crystallinity of an active layer even in a nitride semiconductor layer having a good ground after undergoing the first growth step and second growth step according to the present invention. Thus, introduction of H$_2$ is not preferable.

However, when growth takes place in the presence of excessive quantities of nitrogen source material which is an active gas, since nitrogen removal is reduced, the component ratio of the inactive gas among all gasses making up the main flow can be lowered to about 0.4, according to studies conducted by the present inventors.

Regarding the active layer structure, and in particular, the quantum well layer of the quantum well active layer structure, which can be fabricated in the epitaxial growth step of the stacked structure in the third step, their thickness can be selected as desired, but preferably the thickness is between about 0.5 nm and 5.0 nm, more preferably between 1.0 nm and 3.0 nm, and most preferably between 1.5 nm and 2.5 nm. This is because electron-hole pairs injected or generated in a multi-quantum well active layer structure formed on a polar plane tend to be separated spatially and it is considered appropriate to use ultrathin quantum well layers in order to prevent the separation.

Now a supplementary explanation will be given from the standpoint of crystal quality, in particular. As described above, the present invention is preferably applied to homoepitaxial growth on a nitride substrate. In addition, the present invention has realized high-quality epitaxial growth in the formation of the first nitride semiconductor layer and second nitride semiconductor layer. Consequently, dislocation density in the epitaxial layer according to the present invention is very low compared to heteroepitaxial growth on a sapphire substrate and the like. This makes it possible to achieve good light emission characteristics even if the localization effect of In on electron-hole pairs is reduced, i.e., even if an InGaN layer with low In composition is used as a quantum well layer as described above.

In homoepitaxial growth on a GaN substrate, if an InGaN layer with high In concentration is formed on the GaN layer, the InGaN layer is subjected to a compressive stress along the growth plane. Consequently, with an InGaN/GaN quantum well active layer structure formed by a method which can form only non-flat structures having poor morphology and a lot of point defects as in the case of conventional epitaxial growth on sapphire substrates, it is necessary to increase In concentration and improve luminous intensity by the localization effect of In. The situation is much the same with an InGaN/GaN quantum well active layer structure formed by a method which can form only non-flat structures having poor morphology and a lot of point defects as in the case of conventional homoepitaxial growth on GaN substrates.

On the other hand, proper light emission can be expected when the In composition of the InGaN quantum well layer is in a relatively low range of 0.04 to 0.10 which is suitably used in the present invention. In addition, the present invention has realized flatness in the formation of the first nitride semiconductor layer and second nitride semiconductor layer as described above. Therefore, when a multi-quantum well active layer structure is included in a stacked structure optionally formed on the first and second nitride semiconductor layers, the present invention can form an increased number of quantum well layers in the multi-quantum well active layer structure.

This is preferable when the In composition of the InGaN quantum well layers is in a relatively low range of 0.04 to 0.10—which is a preferred form of the present invention—because internal stresses of the InGaN quantum well layers are relatively low, making lamination easier, in particular. With the method according to the present invention, preferably the number of well layers in a multi-quantum well active layer structure is 2 to 100, more preferably 4 to 50, still more preferably 6 to 25, and most preferably 8 to 15.

Thus, it is preferable to provide a larger number of quantum well layers than usual in the quantum well active layer structure, which can be fabricated in the epitaxial growth step of the stacked structure in the third step. This is because the growth method according to the present invention can form the second nitride semiconductor layer as a high-quality flat layer on the first nitride semiconductor layer as well as because internal stresses are relatively low, making lamination easier when the In composition of InGaN is in a relatively low range of 0.04 to 0.10—which is a range used preferably.

Although a layer containing a possible p-type dopant material may be selected anywhere on the second nitride semiconductor layer, it is preferable to provide a stacked structure including an MQW layer on the second nitride semiconductor layer and further provide, thereon, a layer containing a possible p-type dopant material (step E). In step E, preferably Mg is used as p-type dopant and preferably the concentration of Mg is in the range of $1 \times 10^{19}$ cm$^{-3}$ to $8 \times 10^{19}$ cm$^{-3}$. The reasons are as follows.

Mg is not easily taken into a nitride crystal, the concentration of Mg being a rate-controlling factor thereof. The way the Mg is taken in depends greatly on the flatness of the surface. Therefore, when an epitaxial layer has poor surface flatness, it is difficult to control Mg concentration on the surface of the base. This may result in an unintentionally low concentration or conversely in accidental formation of a layer with a very high concentration. On the other hand, the structure with good surface conditions according to the present invention can control Mg concentration stably with good repeatability, making it possible to select a target value of Mg concentration just as intended from a relatively wide range, as required.

That is, there is no chance of carrying out epitaxial growth with the target value of Mg concentration intentionally lowered to avoid accidental formation of a layer with a very high concentration and ending up with an extremely low concentration as is the case with the conventional method. Therefore, dopant concentration in a layer formed on an epitaxial layer with excellent surface flatness and containing a possible p-type dopant material can be set to a range considered to be suitable for AlGaN-based nitride semiconductor. Preferably the dopant concentration is in the range of $1 \times 10^{19}$ cm$^{-3}$ to $8 \times 10^{19}$ cm$^{-3}$, and more preferably in the range of $2 \times 10^{19}$ cm$^{-3}$ to $6 \times 10^{19}$ cm$^{-3}$.

Preferably a layer containing a possible p-type dopant material is a layer which contain $Al_xGa_{1-x}N$ (0≤x≤1). In particular, when a center wavelength of light emitted from an InGaN/GaN quantum well active layer structure with low In concentration suitably used in the present invention is between 370 nm and 430 nm, to prevent the light emitted from the active layer structure from being absorbed by the layer containing a possible p-type dopant material, desirably $Al_xGa_{1-x}N$ (0≠x) is satisfied.

According to the present invention, even when the first nitride semiconductor layer, second nitride semiconductor layer formed thereon, and active layer structure further formed thereon can have high flatness. Consequently, a good $Al_xGa_{1-x}N$ (x#≠0) layer containing a possible p-type dopant material can be formed suitably on the above-described layers even when the $Al_xGa_{1-x}N$ (x≠0) layer has an Al composition and a layer thickness both of which are higher than usual.

Generally, AlGaN layer on GaN substrate is subject to an internal tensile stress. The stress increases with increases in the Al composition and film thickness, resulting in development of cracks and the like as well as in introduction of defects. However, on the flat epitaxial layers with less defects realized by the present invention, the degree of stress is reduced. This makes it possible to grow a high-quality AlGaN layer even if the Al composition and film thickness are relatively high.

According to studies conducted by the present inventors, the range of Al composition which can be used suitably is 0.02 to 0.20, and more preferably 0.03 to 0.15. Preferably the film thickness is 0.05 μm to 0.25 μm, more preferably 0.10 μm to 0.20 μm, and most preferably 0.12 μm to 0.18 μm. If a p electrode is formed on a semiconductor light-emitting element according to the present invention, it is preferable to insert a thin film of, for example, $Al_{0.025}Ga_{0.975}N$ with low Al composition as a layer to interface with the electrode to reduce contact resistance between the quantum well active layer structure and the electrode. At the same time, $Al_{0.10}Ga_{0.90}N$ can be formed on the quantum well active layer structure from the standpoint of preventing light absorption as described above. In this way, it is useful and preferable to provide two layers of possible p-type dopant material in order to improve both optical characteristics and electrical characteristics.

Although a growth atmosphere for use to grow the layer containing a possible p-type dopant material—for example, an $Al_xGa_{1-x}N$ (0≤x≤1) layer—can be selected as required, preferably an inactive gas is used. In particular, from the standpoint of preventing carbon and other impurities from getting mixed in, it is preferable to use an atmosphere whose principal component is active, $H_2$ gas for growth. On the other hand, when importance is attached to surface flatness, it is preferable to use an atmosphere whose principal component is $N_2$ for growth.

When the layer containing a possible p-type dopant material—for example, an $Al_xGa_{1-x}N$ (0≤x≤1) layer—is formed, preferably the temperature of the base for growth is in the range of 700° C. to 1,350° C., more preferably in the range of 750° C. to 1,200° C., still more preferably in the range of 800° C. to 1,150° C., and most preferably in the range of 900° C. to 1100° C.

The pressure at which the epitaxial layer containing a possible p-type dopant material is formed is preferably 30 kPa or above from the standpoint of reducing generation of defects resulting from introduction of Mg, and 120 kPa or below from the standpoint of inhibiting vapor phase reactions as described above.

After the layers are epitaxially grown in the manner described above without intentional supply of an Si source material in a initial stage of growth, the nitride semiconductor need to be taken out of the growth reactor. For that, a cooling step may be carried out following any desired procedures, but preferably the following cooling conditions are observed. Specifically, an activation process can be performed during cooling to turn that part of the epitaxial layer which contains a possible p-type dopant material into a p-type layer (in-process activation step during cooling).

In that case, according to studies conducted by the present inventors, if a flat epitaxial layer including the layer containing a possible p-type dopant material has been formed on a base, the possible p-type dopant material can be activated as follows in the cooling step schematically shown in FIG. 2(A).

Specifically, immediately after the supply of the III group source material and dopant source material is stopped, the temperature of the base is started to be lowered, where available methods for lowering the substrate temperature include natural cooling, slow cooling under temperature control, and gas cooling by means of supplied gas. In the codling step, $N_2$ supply is continued, or an inactive gas is supplied, or $N_2$ supply is continued with additional supply of another inactive gas. $H_2$ supply is sufficiently decreased or stopped if $N_2$ is supplied in the growth steps, the $NH_3$ flow rate is decreased in the coding step compared to the growth steps, and then $NH_3$ is supplied until an appropriate temperature is reached. Subsequently, the substrate temperature is further lowered using only $N_2$ gas, or only inactive gas, or gas mixture of N gas and inactive gas.

The present inventors have found that a layer formed on a nonpolar plane, having a flat surface, and containing a possible p-type dopant material can be turned into a p-type layer using the procedures described above. The reason why the $NH_3$ flow rate is decreased in the cooling step compared to the growth steps and then $NH_3$ is supplied until an appropriate temperature is reached before stopping the $NH_3$ supply is to prevent nitrogen, which is a constituent element of the epitaxial layer, from escaping from the surface. This is analogous to the technical idea of the present invention concerning the heating step.

Furthermore, according to studies conducted by the present inventors, an optimum p-type dopant activation sequence depends on the material of the outermost surface.

For example, if the outermost surface is a GaN layer, after the end of the crystal growth sequence (i.e., after the supply of Ga source material such as TMGa and TEGa as well as Mg source material such as $Cp_2Mg$ is stopped and the cooling step is started, in this case), preferably the flow rate of $NH_3$ is from 100 sccm to 1 slm both inclusive. On the other hand, if the outermost surface is a AlGaN layer, whose surface is less prone to nitrogen escape, after the supply of III group source material such as TMGa, TEGa, and TMAl as well as Mg source material such as $Cp_2Mg$ is stopped and the cooling step is started, preferably the flow rate of $NH_3$ is from 30 sccm to 100 sccm both inclusive. In either case, in the cooling step, preferably introduction of $NH_3$ is continued at least until a temperature of 965° C. is reached, and stopped not later than when a temperature of 550° C. is reached at the longest. In the cooling step, if the $NH_3$ supply is stopped at an excessively high temperature, surface roughness will result. On the other hand, if the $NH_3$ supply is continued until an excessively low temperature is reached, the H atoms of $NH_3$ will be fixed in the crystal, reducing the activation rate of Mg. Thus, it is most preferable to stop the $NH_3$ supply at a temperature between 950° C. and 750° C.

The pressure range for the cooling step can be set as desired, but according to studies conducted by the present inventors, preferably the pressure is set between about 13 kPa and 203 kPa although the cooling step can be carried out under any of reduced pressure, normal pressure, and increased pressure. In particular, conditions of reduced pressure is preferable in that removal of H atoms is facilitated while conditions of increased pressure is preferable in that it becomes easier to turn the layer containing a possible p-type dopant material into a p-type layer and that surface flatness is ensured. Incidentally, if the pressure is close to the pressure used for epitaxial growth of a stacked structure, it is preferable to take productivity and the like into consideration.

After the cooling step, post-processing thermal annealing after cooling may be performed by increasing the temperature of the epitaxy apparatus again or on another apparatus. Alternatively, after the cooling step, a step of turning that part of the epitaxial layer which contains a possible p-type dopant material into a p-type layer (post-processing activation step after cooling) may be carried out separately by performing electron irradiation or the like.

Incidentally, it is optional whether or not an epitaxial layer subjected to the in-process activation step during cooling according to the present invention is subjected again to the post-processing activation step after cooling. When the epitaxial layers formed on a nonpolar plane with excellent flatness realized by the present invention are subjected to the post-processing activation step after cooling by means of so called heat annealing, preferably the temperatures used are between 650° C. and 850° C., and most preferably between 680° C. and 780° C.

Preferably the duration of annealing is 1 minute to 30 minutes, and most preferably 3 minute to 10 minutes. Preferably the atmosphere is an oxygen atmosphere, nitrogen atmosphere, or combination thereof. Besides, the post-processing activation step after cooling may be carried out by means of electron irradiation.

In the present invention, when the first nitride semiconductor layer, second nitride semiconductor layer formed thereon, and active layer structure which can be further formed thereon are grown homoepitaxially on a freestanding GaN substrate used especially preferably and when there is a layer preferably formed thereon and containing a possible p-type dopant material, the step of turning the epitaxial layer containing a possible p-type dopant material into a p-type layer is preferably carried out as an in-process activation step during cooling rather than as a separate, post-processing activation step after cooling, when viewed as a whole, because of simplicity and reduced damage.

Figure 3A:
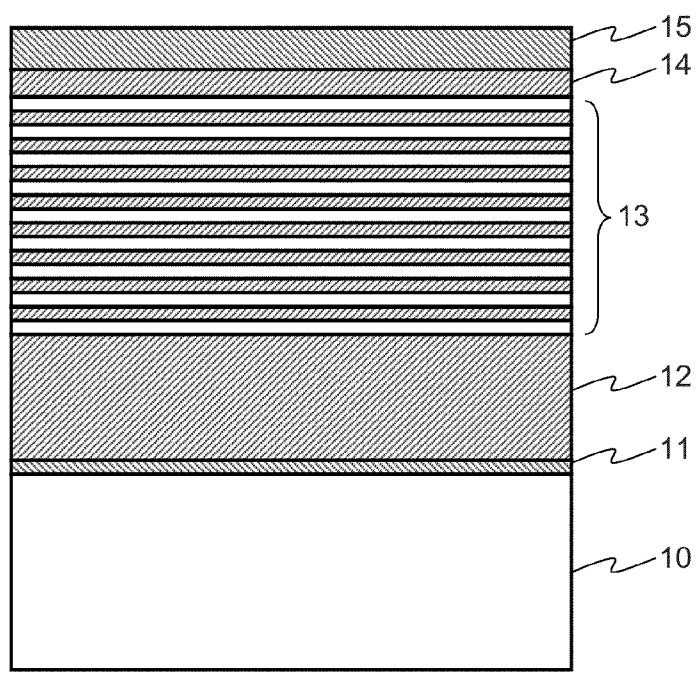
FIG. 3(A) is a simplified sectional view for illustrating an example of a nitride semiconductor according to the present invention.

FIG. 3(A) is a simplified sectional view for illustrating an example of the nitride semiconductor according to the present invention, obtained in the manner described above, where a GaN layer 11 not intentionally doped with Si and an n-type GaN layer 12 intentionally doped with Si are stacked on a GaN substrate 10 which is a freestanding GaN substrate whose principal plane is the (0001) plane, an InGaN/GaN multi-quantum well active layer structure 13 formed by alternately laminating InGaN quantum well layers and GaN barrier layers is provided on the n-type GaN layer 12, and an Mg-doped AlGaN layer 14 and a GaN layer are formed on the multi-quantum well active layer structure 13. The In concentration in the InGaN quantum well layers shown in FIG. 3(A) by way of example is, for example, 0.04 to 0.18 in terms of composition ratio, and the InGaN/GaN multi-quantum well active layer structure 13 is capable of emitting light with a wavelength of 370 to 470 nm. According to the present invention, preferably the InGaN/GaN multi-quantum well active layer structure 13 contains 0.04 to 0.10 of InGaN in terms of In composition ratio to emit light with a center wavelength of 370 nm to 430 nm.

Figure 4:
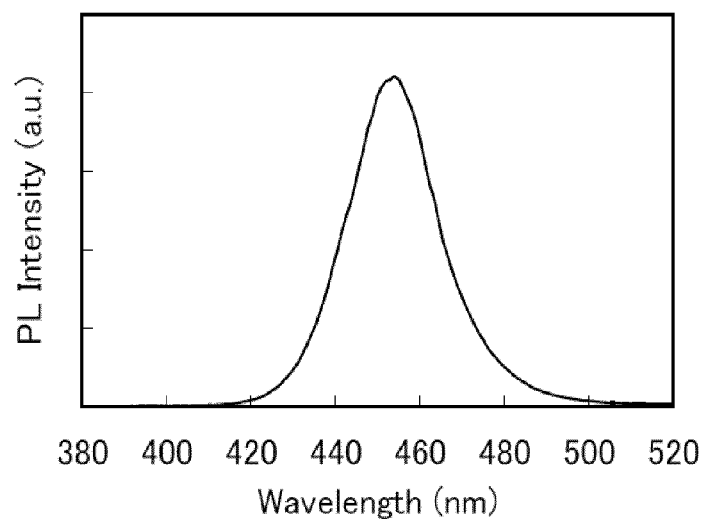
FIG. 4 is a diagram showing results of PL emission measurements used to examine dependence on a mixed gas atmosphere (dependence on constituent gas types of a main flow) in step A (during heating)
Figure 4:
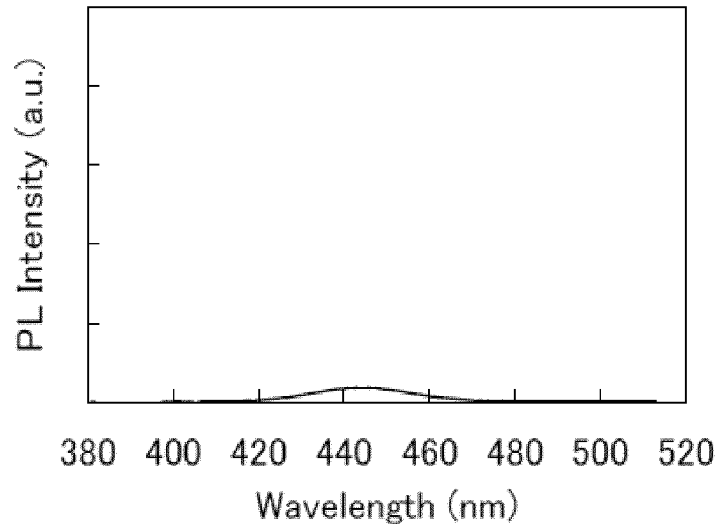

FIG. 4 is a diagram showing results of PL emission measurements used by the present inventors to examine changes in light emission characteristics with the type of constituent gas of the main flow in the second heating step. The PL emission characteristics shown in FIG. 4(A) are obtained from an LED specimen fabricated using a nitride semiconductor according to the present invention grown in the main flow of an atmosphere containing a gas mixture of nitrogen gas and $NH_3$ gas in the second heating step. The PL emission characteristics shown in FIG. 4(B) are obtained from an LED specimen fabricated using a nitride semiconductor grown in the main flow of an atmosphere containing a gas mixture of hydrogen gas and $NH_3$ gas in the second heating step. Both LED specimens are light-emitting elements having the stacked structure in FIG. 3(A) and fabricated using a (0001)-plane freestanding GaN substrate for epitaxial growth.

The two LED specimens differ only in the type of constituent gas of the main flow used during heating. Otherwise, the two LED specimens were fabricated under the same growth conditions. Nevertheless, the PL emission from the active layer structure (MQW structure) of the LED specimen according to the present invention produced in the main flow of the atmosphere containing a gas mixture of nitrogen gas and $NH_3$ gas in the second heating step (FIG. 4(A)) shows much higher intensity than the PL emission from the active layer structure of the LED specimen produced in the main flow of the atmosphere containing a gas mixture of hydrogen gas and $NH_3$ gas in the second heating step (FIG. 4(B)). The difference in the PL intensity results from difference in crystallinity between the two LED specimens, and the crystallinity of the active layer structure reflects difference in crystallinity of the underlying first and second nitride layers.

This confirms that if the first nitride semiconductor layer is epitaxially grown in the main flow of atmosphere containing a gas mixture of active, $NH_3$ gas and inactive, nitrogen gas in the second heating step as with the present invention, it is possible to stack a nitride semiconductor layer with high crystallinity on the first nitride semiconductor layer, resulting in high device characteristics.

Figure 5:
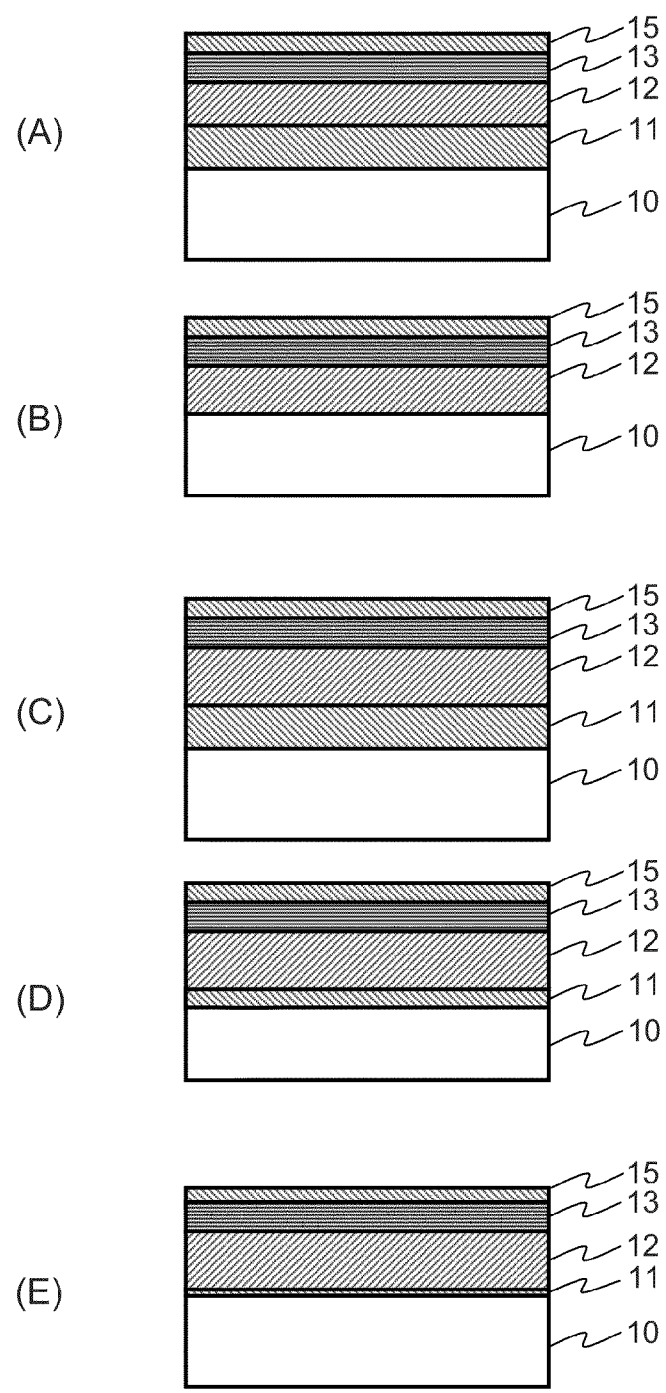
FIG. 5 is a diagram showing simplified sectional views of LED specimens obtained by growing a first nitride layer (first GaN layer) under five different conditions, respectively, and illustrating results of examining pressure and doping conditions during heating (step A) and during epitaxial growth (step B) of the first nitride layer (first GaN layer)
Figure 6:
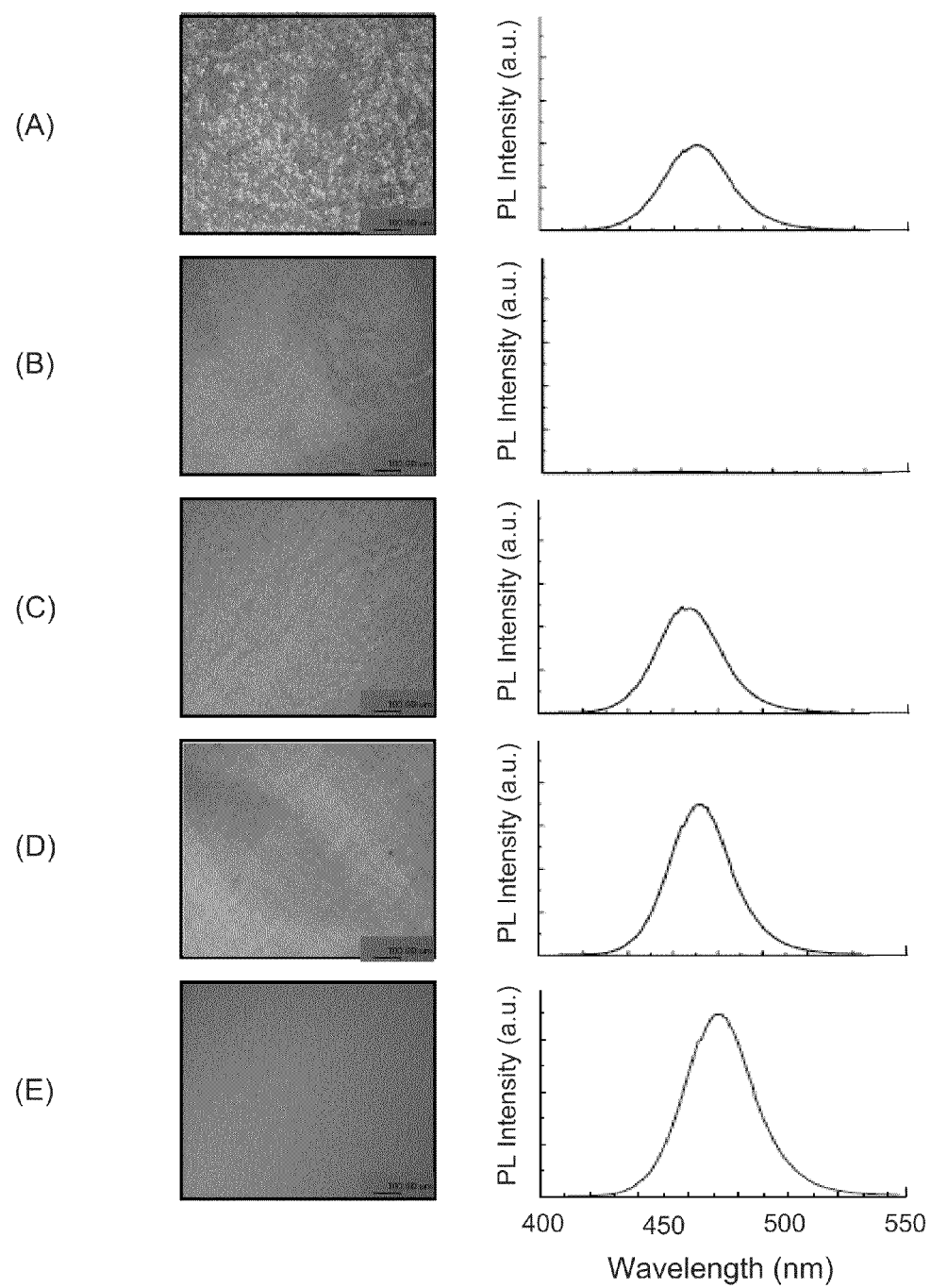
FIG. 6 is a diagram showing surface morphology (differential interference microscope images) and PL spectra (PL emission characteristics from LEDs excited by a laser beam with a wavelength of 325 nm) of the LED specimens and illustrating results of examining pressure and doping conditions during heating (step A) and during epitaxial growth (step B) of the first nitride layer (first GaN layer)

FIGS. 5 and 6 are diagrams for illustrating results of examining pressure and doping conditions (see Table 1) during the second heating step and during epitaxial growth (step B) of the first nitride layer (first GaN layer), where FIG. 5 shows simplified sectional views of LED specimens obtained by growing the first nitride layer (first GaN layer) under five different conditions, respectively, while FIG. 6 shows surface morphology (differential interference microscope images) and PL spectra (PL emission characteristics from LED structures excited by a laser beam with a wavelength of 325 nm) of the LED specimens. Incidentally, (0001)-plane freestanding GaN substrates were used for epitaxial growth of the specimens and a gas mixture of nitrogen gas and $NH_3$ gas was used as constituent gases of the main flow in the second heating step.

TABLE 1

| Specimen No. | A | B | C | D | E |
|---|---|---|---|---|---|
| Reactor pressure during second heating step and first growth step (kPa) | 40 | 13 | 40 | 40 | 40 |
| Dopant in first nitride layer | Si | Si | non | non | non |
| Thickness of first nitride layer (μm) | 0.8 | 1 | 0.8 | 0.15 | 0.05 |

With specimen A whose first nitride layer was intentionally doped with Si, there is a noticeable deterioration of morphology with a lot of defects on the surface. On the other hand, with specimen B whose first nitride layer was also intentionally doped with Si (in specimen B, since the nitride semiconductor layer underlying the MQW layer 13 is a single GaN layer, the second GaN layer 12 is a de facto "first GaN layer"), part of the surface contains some irregularities which, however, are not so severe as to cause surface roughness which would affect device characteristics, and surface conditions are acceptable. However, regarding PL characteristics of specimen B, light emission is so weak as to be barely noticed, indicating that characteristics of the active layer were impaired. The results suggest that the excessively reduced reactor pressure (13 kilopascals) during the second heating step and first nitride layer growth step reduced the crystallinity of the first GaN layer in a microscopic sense, degrading the characteristics of the active layer.

On the other hand, with specimens C, D, and E whose first nitride layer was epitaxially grown without intentional Si doping, the surface conditions are generally good and there is PL emission with sufficient intensity from the active layer. Thus, it can be seen that when the first nitride layer is epitaxially grown without intentional Si doping with the reactor pressure set at 35 kilopascals during heating, the GaN film stacked thereon has excellent surface conditions and light emission characteristics.

Among specimens C, D, and E, specimen E whose first nitride layer is 0.05 μm (50 nm) thick has excellent surface conditions and light emission characteristics, suggesting that this is an appropriate thickness of the first GaN layer. Based on these studies, the present inventors have concluded that to obtain a nitride semiconductor film with excellent surface conditions and light emission characteristics, preferable thickness of the first nitride semiconductor layer epitaxially grown without intentional Si doping is 0.1 nm to 150 nm.

The present inventors interpret these experimental results as follows. Nitride or other surfaces formed on a single-crystal substrate surface or dissimilar substrate as epitaxially grown surfaces are often intentionally or unintentionally doped with Si. Also, even under ideal circumstances without Si doping, Si is used for components of MOCVD reactors and contained as residual impurities in main flow gases, metal-organic materials, and the like. Consequently, it is considered that Si always exists on the substrate surface during epitaxial growth.

Under these circumstances, in which Si exists on the substrate surface in the initial stage of epitaxial growth, if the layer formed in the initial growth stage, i.e., the first nitride semiconductor layer, is intentionally doped with Si, it is likely that growth will be inhibited noticeably by products resulting from vapor-phase reaction of Si. Consequently, in a microscopic sense, the first nitride semiconductor layer in the initial stage of growth starts local crystal growth in the surface. Once such non-uniform crystal growth within the surface is started, a film with poor surface morphology is likely to result subsequently.

Thus, in the initial stage of epitaxial growth of a nitride semiconductor layer, it is important to thoroughly eliminate intentional supply of products which can cause non-uniform crystal growth within the surface. Once uniform crystal growth is started within the surface, surface morphology will not deteriorate noticeably even in the case of crystal growth of, for example, an Si-doped nitride semiconductor. This is why according to the present invention, the first nitride semiconductor layer is grown without intentional Si doping.

Of course, since vapor-phase reaction of $SiH_4$ and $NH_3$ can easily be inhibited by reducing the pressure in the reactor, specimen B which uses a Si-doped film for the first nitride semiconductor layer intentionally provides more or less good surface conditions, where $SiH_4$ is supplied into the reactor using $H_2$ gas contained in the second main flow, as a carrier gas and $NH_3$ makes up the first main flow. However, excessively reduced pressure in the reactor induces nitrogen removal from the surface, thereby introducing defects and consequently reducing microscopic crystallinity. Thus, to reduce both introduction of defects into the first nitride semiconductor layer and impediments to growth caused by vapor phase reactions of the Si source, it is desirable not to excessively reduce the reactor pressure, but to keep the reactor pressure at 35 kilopascals or above and epitaxially grow the first nitride semiconductor layer without Si doping.

Thus, it is considered only necessary that the first nitride semiconductor layer according to the present invention does not contain elements which act as growth constraints. Consequently, there are various modes for forming a GaN layer without intentional Si doping. When not intentionally doped with Si, the first nitride semiconductor layer can be made of a III-V group nitride semiconductor (which hereinafter may be referred to collectively as a GaN-based semiconductor) such as InN, AlN, BN, GaInN, GaAlN, GaBN, InAlN, InBN, AlBN, GaInAlN, GaInBN, InAlBN, or GaInAlBN. Furthermore, there can also be a mode for epitaxially growing the first nitride semiconductor layer by supplying a possible dopant element other than Si—such as O, Mg, or Zn.

It was also confirmed that when a nitride semiconductor layer is newly formed on the first nitride semiconductor layer formed in the above manner, the surface morphology and optical characteristics of the newly formed nitride semiconductor layer are hardly deteriorated even if the pressure in the reactor is reduced or Si doping is used, to increase growth speed or for other purposes.

Thus, it is considered only necessary that the first nitride semiconductor layer according to the present invention does not contain elements which act as growth constraints. Consequently, there are various modes for forming a GaN layer without intentional Si doping. When not intentionally doped with Si, the first nitride semiconductor layer can be made of a III-V group nitride semiconductor (which may be referred to collectively as a GaN-based semiconductor) such as InN, AlN, BN, GaInN, GaAlN, GaBN, InAlN, InBN, AlBN, GaInAlN, GaInBN, InAlBN, or GaInAlBN. Furthermore, there can also be a mode for epitaxially growing the first nitride semiconductor layer by supplying a possible dopant element other than Si—such as O, Mg, or Zn.

As shown in examples described later, it has been confirmed that if the first nitride semiconductor layer is not intentionally doped with Si even if intentionally doped with Mg or the like, when a nitride semiconductor layer is newly grown on the first nitride semiconductor layer, the surface morphology and optical characteristics of the entire epitaxial layer formed subsequently are hardly deteriorated. In particular, the present inventors have confirmed that when a GaN material is used, an Mg-doped layer rather than an Si-doped or undoped layer has excellent heat resistance in relation to adherence to the ground.

Thus, an Mg-doped layer, even if doped with unintentionally mixed Si as well, can be used suitably as a first nitride semiconductor layer when heat resistance is required in relation to adherence to the surface of the base. Preferably such a layer co-doped with Mg and Si is used, for example, in template fabrication or the like.

On the other hand, a first nitride semiconductor layer not intentionally doped with Si can suitably be used for light-emitting elements, electronic devices, and similar applications. In particular, the first nitride semiconductor layer can suitably be used for light-emitting elements and the like even if unintentionally doped with Si, when the concentration of the impurity can be kept between $3 \times 10^7$ $cm^{-3}$ and $1 \times 10^{21}$ $cm^{-3}$ both inclusive at peak in the case of Si.

Consequently, the present invention can achieve very flat morphology on the outermost surface of the epitaxial layer obtained by laminating the second nitride semiconductor layer onto the first nitride semiconductor layer or obtained by further forming a stacked structure thereon.

In particular, when the surface is measured with a contact-type surface roughness gage to determine average surface roughness, namely center line average roughness (Ra), which is an index of irregularity, preferably Ra of the outermost surface of the nitride semiconductor layer according to the present invention is 13.0 nm or below, more preferably 10.0 nm or below, still more preferably 8.0 nm or below, and most preferably 5.5 nm or below.

The value of Ra used herein is determined by linearly scanning the specimen surface with a stylus to obtain a roughness curve, turning around the roughness curve at a center line, and dividing the area defined by the turned roughness curve and the center line by the scan length.

The present invention will be described more concretely below with reference to examples and comparative examples.

Example 1

In the present example, a stack of gallium nitride-based semiconductor thin films was grown by the MOCVD process and a blue-color LED was fabricated. A series of crystal growth processes for that has already been outlined with reference to FIG. 2(A). Also, a layer structure after growth is schematically shown in FIG. 3(A).

The base used was a (0001)-oriented (c+ oriented) freestanding GaN substrate. The substrate was n-type and carrier concentration was $2.4 \times 10^{17}$ $cm^{-3}$. The full-width at half maximum of a (10-12) X-ray reflection rocking curve was 64 arcsec., OFF angle in the (1-100) direction was 0.11 degrees, and OFF angle in the (11-20) direction was 0.36 degrees. Also, the dislocation density was $4.9 \times 10^6$ $cm^{-2}$. The (0001)-oriented freestanding GaN substrate was placed on a tray (susceptor) in a horizontal quartz reactor which normally operates under conditions of normal pressure. The pressure in the reactor was 100±2 kPa in all steps. First, in the first heating step, the base was heated by supplying $N_2$ as a main flow into the reactor at 10 L/min. When the temperature of the base reached 500° C., the second heating step was started. In the second heating step, $NH_3$ was supplied as a constituent gas of the first main flow at 7.5 L/min. and $N_2$ was supplied as a constituent gas of the second main flow at 12.5 L/min.

Subsequently, the substrate temperature was further raised to 1,000° C. by increasing $NH_3$ and $N_2$ to 10 L/min. and 30

L/min., respectively. Meanwhile, a subflow of $N_2$ gas was supplied at 20 L/min. and a non-growth-related flow of $N_2$ was supplied for purge and other purposes at 19 L/min. in total. In the second heating step, the flow ratio Fp of the inactive gas component to all the constituent gases of the main flow was 0.625 at the start of the second heating step, and 0.75 when the growth temperature was reached.

Next, in step B, $NH_3$ was supplied as a constituent gas of the first main flow at 10 L/min. On the other hand, as constituent gases of the second main flow, $H_2$ (30 L/min.) and TMGa (0.0018 L/min. at a concentration of 100%) were supplied into the reactor, where $H_2$ (0.5 L/min.) contained in the main flow was used as a carrier gas to supply the TMGa. By supplying these main flow gases, an undoped GaN layer (first nitride semiconductor layer) was grown to a thickness of 40 nm (step B). Meanwhile, a gas mixture (20.5 L/min.) of $NH_3$ (0.5 L/min.) and $N_2$ (20 L/min.) was supplied as a subflow. Also, a non-growth-related flow of $N_2$ was supplied for purge and other purposes at 19 L/min. During the growth of the first nitride semiconductor layer, the flow ratio Fa of the active gas component to all the constituent gases of the main flow was 0.99996.

Next, in step C, $NH_3$ was supplied as a constituent gas of the first main flow at 10 L/min. Besides, $H_2$ (40 L/min.), TMGa (0.0055 L/min. at a concentration of 100%), and $SiH_4$ ($6\times10^{-7}$ L/min. at a concentration of 100%) were supplied as constituent gases of the second main flow, where TMGa was supplied using $H_2$ (0.5 L/min.) contained in the main flow, as a carrier gas, and $SiH_4$ was supplied using $H_2$ (0.2 L/min.) contained in the main flow, as a carrier gas and using $H_2$ (0.06 L/min.) as a diluent gas. By supplying these main flow gases, an Si-doped GaN layer (second nitride semiconductor layer) was grown to a thickness of 7 µm (step C).

Meanwhile, a gas mixture of $NH_3$ (0.5 L/min.) and $N_2$ (25 L/min.) was supplied as a subflow at 25.5 L/min. Also, a non-growth-related flow of $N_2$ was supplied for purge and other purposes at 19 L/min. During the growth of the second nitride semiconductor layer, the flow ratio Fa of the active gas component to all the constituent gases of the main flow was 0.99989.

Next, the temperature of the base (substrate temperature) was set to 740° C. When the substrate temperature was stabilized sufficiently, a multi-quantum well active layer structure was formed by laminating a quantum well layer of $In_{0.15}Ga_{0.85}N$ (with a thickness of 1.8 nm) and a GaN barrier layer (with a thickness of 12 nm) alternately for eight cycles (step D). To grow the GaN barrier layers, $NH_3$ (10 L/min.) was used as a constituent gas of the first main flow. $N_2$ (18.5 L/min.), $H_2$ (1.5 L/min.), and TMGa (0.000017 L/min.) were supplied as constituent gases of the second main flow, where $H_2$ (0.5 L/min.) contained in the main flow was used as a carrier gas to supply the TMGa.

To grow the quantum well layers of $In_{0.15}Ga_{0.85}N$, $NH_3$ (10 L/min.) was used as a constituent gas of the first main flow. $N_2$ (20 L/min.), TMGa (0.000015 L/min.), and TMIn (0.00023 L/min.) were supplied as constituent gases of the second main flow, where $N_2$ contained in the main flow was used as a carrier gas at 0.5 L/min. each to supply the TMGa and TMIn. In step D, a gas mixture of (0.5 L/min.) and $N_2$ (25 L/min.) was supplied as a subflow at 25.5 L/min. Also, a non-growth-related flow of $N_2$ was supplied for purge and other purposes at 19 L/min. During the growth of the multi-quantum well active layer structure, the flow ratio Fp of the inactive gas component to all the constituent gases of the main flow was 0.61667 in the case of the GaN barrier layers, and 0.6666 in the case of the InGaN well layers.

Next, the substrate temperature was set to 1,000° C. and an Mg-doped $Al_{0.1}Ga_{0.9}N$ layer 50 nm thick was formed (step E). $NH_3$ (10 L/min.) was used as a constituent gas of the first main flow. $H_2$ (80 L/min.), TMAl (0.0001 L/min.), TMGa (0.0018 L/min.), and $Cp_2Mg$ ($4\times10^{-6}$ L/min.) were used as constituent gases of the second main flow, where $H_2$ contained in the main flow was used as a carrier gas at 0.5 L/min. each to supply the TMAl, TMGa, and $Cp_2Mg$.

An Mg-doped GaN layer 70 nm thick was epitaxially grown further on the Mg-doped $Al_{0.1}Ga_{0.9}N$ layer (step E). The GaN layer was grown by stopping the supply of TMAl and $H_2$ (50 L/min.) out of the main flow gases described above.

In step E, during the growth of the $Al_{0.1}Ga_{0.9}N$ layer, a gas mixture of $NH_3$ (0.5 L/min.) and $N_2$ (50 L/min.) was supplied as a subflow at 50.5 L/min. Also, a non-growth-related flow of $N_2$ (19 L/min) was supplied for purge and other purposes. During the growth of the Mg-doped $Al_{0.1}Ga_{0.9}N$ layer, the flow ratio Fa of the active gas component to all the constituent gases of the main flow was 0.99998.

Also, in step E, during the growth of the Mg-doped GaN layer, a gas mixture of $NH_3$ (0.5 L/min.) and $N_2$ (20 L/min.) was supplied as a subflow at 20.5 L/min. Also, a non-growth-related flow of $N_2$ (19 L/min) was supplied for purge and other purposes. During the growth of the Mg-doped GaN layer, the flow ratio Fa of the active gas component to all the constituent gases of the main flow was 0.99996.

When the growth steps were finished, the substrate temperature was lowered and the gases in the reactor were completely replaced with $N_2$. Then, the substrate was taken out and evaluated.

The surface of the substrate thus fabricated had good flatness although there were very slight irregularities. The surface was measured with a contact-type surface roughness gage to determine center line average roughness (Ra) which is an index of irregularity. As a result, Ra according to the present example was 8.1 nm. Also, when PL characteristics were measured under excitation by a laser beam with a wavelength of 325 nm, the peak wavelength was 469 nm and integrated intensity of the PL characteristics was 60 in relative value, indicating a high intensity.

Example 2

In the present example, a stack of gallium nitride-based semiconductor thin films was grown by the MOCVD process and a blue-color LED was fabricated. A series of crystal growth processes for that has already been outlined with reference to FIG. 2(A). Also, a layer structure after growth is schematically shown in FIG. 3(A).

The base used was a template substrate fabricated by growing a 1-µm-thick undoped GaN layer and 3.5-mm-thick, n-type, GaN layer (with a carrier density of $5\times10^{18}$ cm$^{-3}$) successively on c-plane sapphire. The template substrate was used by being taken out of the reactor once. The base was placed on a tray (susceptor) in a horizontal quartz reactor which normally operates under conditions of normal pressure. The pressure in the reactor was 100±2 kPa in all steps.

First, in the first heating step, the base was heated by supplying a main flow of nitrogen gas into the reactor at 10 L/min. When the temperature of the base reached 500° C., the second heating step was started. In the second heating step, $NH_3$ was supplied as a constituent gas of the first main flow at 7.5 L/min. and nitrogen was supplied as a constituent gas of the second main flow at 12.5 L/min. Subsequently, the substrate temperature was further raised to 1,000° C. by increasing $NH_3$ gas to 10 L/min. Meanwhile, a subflow of $N_2$ was supplied at 20 L/min. and a non-growth-related flow of $N_2$ was supplied for purge and other purposes at 19 L/min. In the second heating step, the flow ratio Fp of the inactive gas component to all the constituent gases of the main flow was 0.625 at the start of the second heating step, and 0.55556 when the growth temperature was reached.

Next, in step B, $NH_3$ was continued to be supplied as a constituent gas of the first main flow at 10 L/min. As constituent gases of the second main flow, hydrogen and TMGa (at a concentration of 100%) were supplied into the reactor at 30 L/min. and 0.0018 L/min., respectively, where $H_2$ (0.5 L/min.) contained in the main flow was used as a carrier gas to supply the TMGa. In this way, an undoped GaN layer (first nitride semiconductor layer) was grown to a thickness of 40 nm.

Meanwhile, a gas mixture of $NH_3$ (0.5 L/min.) and $N_2$ (20 L/min.) was supplied as a subflow at 20.5 L/min. Also, a non-growth-related flow of $N_2$ was supplied for purge and other purposes at 19 L/min. During the growth of the first nitride semiconductor layer, the flow ratio Fa of the active gas component to all the constituent gases of the main flow was 0.99996.

Next, in step C, TMGa (0.0055 L/min. at a concentration of 100%) was supplied using hydrogen (0.5 L/min.) contained in the main flow, as a carrier gas, and $SiH_4$ ($6\times10^{-7}$ L/min. at a concentration of 100%) was supplied using hydrogen (0.2 L/min.) contained in the main flow, as a carrier gas and using hydrogen (0.06 L/min.) as a diluent gas. Under these conditions of gas supply, a crystal of an n-type GaN layer (second nitride semiconductor layer) was grown to a thickness of 10 μm.

Meanwhile, a gas mixture of $NH_3$ (0.5 L/min.) and $N_2$ (25 L/min.) was supplied as a subflow at 25.5 L/min. Also, a non-growth-related flow of $N_2$ was supplied for purge and other purposes at 19 L/min. During the growth of the second nitride semiconductor layer, the flow ratio Fa of the active gas component to all the constituent gases of the main flow was 0.99989.

Subsequently, steps D and E and the cooling step were carried out under exactly the same conditions as those in Example 1.

The surface of the substrate thus fabricated was extremely flat. When the surface was measured with a surface roughness gage, Ra was 5.4 nm. Also, when measured under excitation by a laser beam with a wavelength of 325 nm, the peak wavelength of the PL spectrum was 464 nm and integrated intensity of the PL spectrum was 25 in relative value, which was acceptable although a little low.

Example 3

In the present example, a stack of gallium nitride-based semiconductor thin films was grown by the MOCVD process and a near ultraviolet LED was fabricated. A series of crystal growth processes for that has already been outlined with reference to FIG. 2(A). Also, a layer structure after growth is schematically shown in FIG. 3(A).

The base used was a (0001)-oriented (c+ oriented) freestanding GaN substrate. The substrate was n-type and carrier concentration was $1.5\times10^{17}$ cm$^{-3}$. The full-width at half maximum of a (10-12) X-ray reflection rocking curve was 90.4 arcsec., OFF angle in the (1-100) direction was 0.55 degrees, and OFF angle in the (11-20) direction was 0.35 degrees. Also, the dislocation density was $5.6\times10^6$ cm$^{-2}$. The (0001)-oriented freestanding GaN substrate was placed on a quartz tray (susceptor) in a horizontal quartz reactor which normally operates under conditions of normal pressure. The pressure in the reactor was 100±2 kPa in all steps. The base was heated in exactly the same manner as in Example 1. Thus, in the second heating step, Fp was 0.625 at the start of the step, and 0.75 when the growth temperature was reached.

Next, in step B, $NH_3$ (10 L/min) was continued to be supplied as a constituent gas of the first main flow. As constituent gases of the second main flow, hydrogen and TMGa were supplied into the reactor at 30 L/min. and 0.0018 L/min. (at a concentration of 100%), respectively, where hydrogen contained in the main flow was used as a carrier gas at 0.5 L/min. to supply the TMGa. Under these conditions of gas supply, an undoped GaN layer (first nitride semiconductor layer) was grown to a thickness of 0.2 nm. Meanwhile, a gas mixture of $NH_3$ (0.5 L/min.) and $N_2$ (20 L/min.) was supplied as a subflow at 20.5 L/min. Also, a non-growth-related flow of $N_2$ was supplied for purge and other purposes at 19 L/min. Thus, during the growth of the first nitride semiconductor layer, the flow ratio Fa of the active gas component to all the constituent gases of the main flow was 0.99996 (excluding the subflow and non-growth-related flow).

Next, TMGa was supplied at 0.0055 L/min. (at a concentration of 100%) using hydrogen contained in the main flow, as a carrier gas at 0.5 L/min., and $SiH_4$ was supplied at $6\times10^{-7}$ L/min. (at a concentration of 100%) using hydrogen contained in the main flow, as a carrier gas at 0.2 L/min. and using hydrogen as a diluent gas at 0.06 L/min. Consequently, a crystal of an n-type GaN layer (second nitride semiconductor layer) was grown to a thickness of 5 μm (step C).

Meanwhile, a gas mixture of $NH_3$ (0.5 μL/min.) and $N_2$ (25 L/min.) was supplied as a subflow at 25.5 L/min. During the growth of the second nitride semiconductor layer, the flow ratio Fa of the active gas component to all the constituent gases of the main flow was 0.99989.

Next, the temperature of the base (substrate temperature) was set to 780° C. When the substrate temperature was stabilized sufficiently, a multi-quantum well active layer structure was formed by laminating a quantum well layer of $In_{0.07}Ga_{0.93}N$ (with a thickness of 1.3 nm) and a GaN barrier layer (with a thickness of 13 nm) alternately for eight cycles (step D). To grow the GaN barrier layers, $NH_3$ (10 L/min.) was used as a constituent gas of the first main flow. Nitrogen, hydrogen, and TMGa were supplied as constituent gases of the second main flow at 18.5 L/min., 1.5 L/min., and 0.000017 L/min. (at a concentration of 100%), respectively, where hydrogen contained in the main flow was used as a carrier gas at 0.5 L/min. to supply the TMGa.

To grow the quantum well layers of $In_{0.07}Ga_{0.93}N$, $NH_3$ was used as a constituent gas of the first main flow at 10 L/min. Nitrogen, TMGa, and TMIn were supplied as constituent gases of the second main flow at 20 L/min., 0.000015 L/min., and 0.00023 L/min., respectively, where nitrogen contained in the main flow was used as a carrier gas at 0.5 L/min. each to supply the TMGa and TMIn.

Meanwhile, a gas mixture of $NH_3$ (0.5 L/min.) and $N_2$ (25 L/min.) was supplied as a subflow at 25.5 L/min. Also, a non-growth-related flow of $N_2$ was supplied for purge and other purposes at 19 L/min. Thus, during the growth of the multi-quantum well active layer structure, the flow ratio Fp of the inactive gas component to all the constituent gases of the main flow was 0.61667 in the case of the barrier layers, and 0.6666 in the case of the well layers (excluding the subflow and non-growth-related flow).

After step D, step E and the cooling step were carried out under exactly the same conditions as those in Example 1.

The surface of the substrate thus fabricated looked good although there were very slight irregularities. When the surface was measured with a surface roughness gage, Ra was 12.2 nm. Also, when measured under excitation by a laser beam with a wavelength of 325 nm, the peak wavelength of the PL spectrum was 387 nm and integrated intensity of the PL spectrum was 69 in relative value, indicating a high intensity.

Example 4

In the present example, a stack of gallium nitride-based semiconductor thin films was grown by the MOCVD process and a near ultraviolet LED was fabricated. A series of crystal growth processes for that has already been outlined with reference to FIG. 2(A). Also, a layer structure after growth is schematically shown in FIG. 3(A). The base used was a template substrate fabricated by growing a 1-μm-thick undoped GaN layer and 3.5-μm-thick, n-type, GaN layer (with a carrier density of $5 \times 10^{18}$ cm$^{-3}$) on c-plane sapphire. The template substrate was used by being taken out of the reactor once. The same growth conditions as in Example 3 were used except that the first nitride semiconductor layer was 1 nm thick and that the second nitride semiconductor layer was 7 μm thick.

The surface of the substrate thus fabricated was extremely flat. When the surface was measured with a surface roughness gage, Ra was 5.0 nm. Also, when measured under excitation by a laser beam with a wavelength of 325 nm, the peak wavelength of the PL spectrum was 391 nm and integrated intensity of the PL spectrum was 74 in relative value, indicating a high intensity.

Example 5

Figure 7:
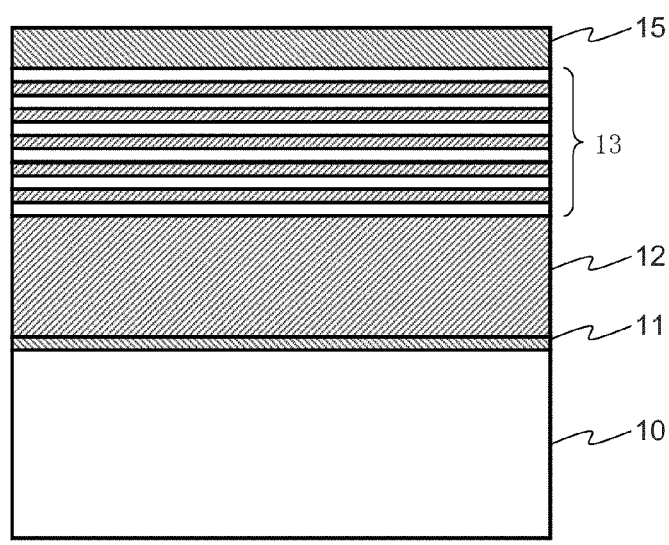
FIG. 7 is a simplified sectional view for illustrating another example of a nitride semiconductor according to the present invention.

In the present example, a stack of gallium nitride-based semiconductor thin films was grown by the MOCVD process and a blue-color LED was fabricated. A series of crystal growth processes for that has already been outlined with reference to FIG. 2(A). Also, a layer structure after growth is schematically shown in FIG. 7. The base used was a (0001)-oriented (c+ oriented) freestanding GaN substrate. The substrate was n-type and carrier concentration was $1.4 \times 10^{17}$ cm$^{-3}$. The full-width at half maximum of a (10-12) X-ray reflection rocking curve was 58.2 arcsec., OFF angle in the (1-100) direction was 0.38 degrees, and OFF angle in the (11-20) direction was 0.74 degrees. Also, the dislocation density was $5.1 \times 10^6$ cm$^{-2}$.

The base was placed on a susceptor in a vertical stainless steel reactor which normally operates under conditions of reduced pressure. No subflow piping was provided in the growth apparatus. First, in the first heating step, with the pressure set to 40 kPa, the base was heated by supplying a main flow of nitrogen gas into the reactor at 20 L/min. When the temperature of the base reached 500° C., the second heating step was started. In the second heating step, NH$_3$ was supplied as a constituent gas of the first main flow at 5 L/min., and nitrogen was supplied as a constituent gas of the second main flow at 15 L/min.

Under these conditions of the main flow, the temperature of the base was raised to 1,040° C. In the second heating step, the flow ratio Fp of the inactive gas component to all the constituent gases of the main flow was 0.75.

Next, the reactor pressure was set to 40 kPa, and NH$_3$ was supplied into the reactor as a constituent gas of the first main flow at 5 L/min. Besides, hydrogen (15 L/min.), nitrogen (2.5 L/min.), and TMGa (0.0022 L/min. at a concentration of 100%) were supplied into the reactor as constituent gases of the second main flow, where hydrogen (0.5 L/min.) contained in the main flow was used as a carrier gas to supply the TMGa.

Under these conditions of the main flow, an undoped GaN layer (first nitride semiconductor layer) was grown to a thickness of 100 nm (step B). During the growth of the first nitride semiconductor layer, the flow ratio Fa of the active gas component to all the constituent gases (excluding non-growth-related flow) of the main flow was 0.8888.

Next, the reactor pressure was set to 8 kPa, and NH$_3$ (10 L/min) was supplied as a constituent gas of the first main flow. Besides, hydrogen (9.8 L/min.), nitrogen (2.7 L/min.), TMGa (0.0071 L/min. at a concentration of 100%), and SiH$_4$ ($6 \times 10^{-7}$ L/min. at a concentration of 100%) were supplied as constituent gases of the second main flow, where TMGa was supplied using hydrogen (0.5 L/min.) contained in the main flow, as a carrier gas, and SiH$_4$ was supplied using nitrogen (0.2 L/min.) contained in the main flow, as a diluent gas. Under these conditions of the main flow, a crystal of an n-type GaN layer (second nitride semiconductor layer) was grown to a thickness of 0.5 μm (step C).

During the growth of the second nitride semiconductor layer, the flow ratio Fa of the active gas component to all the constituent gases of the main flow was 0.87972.

Next, with the reactor pressure set to 67 kPa, a multi-quantum well active layer structure was formed by alternately laminating a In$_{0.15}$Ga$_{0.85}$N (with a thickness of 1.8 nm) with the temperature of the base set at 720° C. and a GaN barrier layer (with a thickness of 12 nm) with the temperature of the base set at 840° C. for five cycles (step D).

During the growth of the GaN barrier layers, NH$_3$ (12 L/min) was supplied as a constituent gas of the first main flow. Besides, nitrogen (9.5 L/min.), hydrogen (0.5 L/min.), and TMGa (0.000013 L/min.) were supplied as constituent gases of the second main flow, where hydrogen (0.5 L/min.) contained in the main flow was used as a carrier gas to supply the TMGa.

During the growth of the In$_{0.15}$Ga$_{0.85}$N quantum well layers, NH$_3$ (12 L/min) was supplied as a constituent gas of the first main flow. Besides, nitrogen (10 L/min.), TMGa (0.00009 L/min.), and TMIn (0.00022 L/min.) were supplied as constituent gases of the second main flow, where nitrogen contained in the main flow was used as a carrier gas at 0.5 L/min. each to supply the TMGa and TMIn.

During the growth of the multi-quantum well active layer structure in step D, the flow ratio Fp of the inactive gas component to all the constituent gases of the main flow was 0.43182 in the case of the barrier layers, and 0.45454 in the case of the well layers.

Next, with the temperature of the base set to 1,000° C. and with the reactor pressure set to 36 kPa, an Mg-doped GaN layer was grown epitaxially (step E). In so doing, NH$_3$ (5 L/min.) was supplied as a constituent gas of the first main flow. Besides, hydrogen (15 L/min.), TMGa, and Cp$_2$Mg were supplied as constituent gases of the second main flow. Under these conditions of the main flow, the Mg-doped GaN layer was grown to 120 nm.

When the growth steps were finished, the substrate temperature was lowered and the gases in the reactor were completely replaced with N$_2$. Then, the substrate was taken out and evaluated.

FIG. 7 is a simplified sectional view of the nitride semiconductor thus obtained. The surface of the nitride semiconductor substrate looked good although there were slight irregularities. When the surface was measured with a surface roughness gage, Ra was 9.7 nm. Also, when measured under excitation by a laser beam with a wavelength of 325 nm, the peak wavelength of the PL spectrum was 462 nm and integrated intensity of the PL spectrum was 165 in relative value, indicating a very high intensity.

Example 6

In the present example, a stack of gallium nitride-based semiconductor thin films was grown by the MOCVD process and a blue-color LED was fabricated. A series of crystal growth processes for that has already been outlined with reference to FIG. 2(A). The base used was a template substrate fabricated by growing a 1-µm-thick undoped GaN layer and 3.5-µm-thick, n-type, GaN layer (with a carrier density of $5 \times 10^{18}$ cm$^{-3}$) on c-plane sapphire. The template substrate was used by being taken out of the reactor once.

The template substrate was placed on a susceptor in a vertical stainless steel reactor which normally operates under conditions of reduced pressure. No subflow piping was provided in the growth apparatus.

First, in the first heating step, with the pressure set to 40 kPa, the base was heated by supplying a main flow of nitrogen gas into the reactor at 20 L/min. When the temperature of the base reached 500° C., the second heating step was started. In the second heating step, NH$_3$ was supplied as a constituent gas of the first main flow at 5 L/min. Also, nitrogen was supplied as a constituent gas of the second main flow at 15 L/min. The attainable heating temperature was 1,040° C. In the second heating step, the flow ratio Fp of the inactive gas component to all the constituent gases of the main flow was 0.75.

Next, NH$_3$ (5 L/min.) was supplied as a constituent gas of the first main flow. Besides, hydrogen (15 L/min.) and TMGa (0.0022 L/min. at a concentration of 100%) were supplied as constituent gases of the second main flow, where hydrogen (0.5 L/min.) contained in the main flow was used as a carrier gas to supply the TMGa. Under these conditions of the main flow, an undoped GaN layer (first nitride semiconductor layer) was grown to a thickness of 100 nm (step B). During the growth of the first nitride semiconductor layer, the flow ratio Fa of the active gas component to all the constituent gases of the main flow was 0.99989.

Next, the reactor pressure was set to 8 kPa, and TMGa (0.0071 L/min. at a concentration of 100%) and SiH$_4$ ($6 \times 10^{-7}$ L/min. at a concentration of 100%) were supplied as constituent gases of the second main flow, where TMGa was supplied using hydrogen (0.5 L/min.) contained in the main flow, as a carrier gas, and SiH$_4$ was supplied using H$_2$ (0.2 L/min.) contained in the main flow, as a diluent gas. Consequently, a crystal of an n-type GaN layer (second nitride semiconductor layer) was grown to a thickness of 15 µm (step C). During the growth of the second nitride semiconductor layer, the flow ratio Fa of the active gas component to all the constituent gases of the main flow was 0.99965.

Subsequently, step D and the cooling step were carried out in the same manner as in Example 5.

The surface of the substrate thus fabricated was extremely flat. When the surface was measured with a surface roughness gage, Ra was 5.5 nm. Also, when measured under excitation by a laser beam with a wavelength of 325 nm, the peak wavelength of the PL spectrum was 471 nm and integrated intensity of the PL spectrum was 128 in relative value, indicating a very high intensity.

Example 7

In the present example, a stack of gallium nitride-based semiconductor thin films was grown by the MOCVD process and a near ultraviolet LED was fabricated. A series of crystal growth processes for that has already been outlined with reference to FIG. 2(A). Also, a layer structure after growth is schematically shown in FIG. 7.

The base used was a (0001)-oriented (c+ oriented) free-standing GaN substrate. The substrate was n-type and carrier concentration was $2.0 \times 10^{17}$ cm$^{-3}$. The full-width at half maximum of a (10-12) X-ray reflection rocking curve was 76 arcsec., OFF angle in the (1-100) direction was 3.14 degrees, and OFF angle in the (11-20) direction was 0.22 degrees. Also, the dislocation density was $6 \times 10^6$ cm$^{-2}$.

The base was placed on a susceptor in a crystal-growth planetary reactor which normally operates under conditions of reduced pressure. First, in the first heating step, with the pressure set to 40 kPa, the base was heated by supplying a main flow of nitrogen gas into the reactor at 30 L/min. When the temperature of the base reached 500° C., the second heating step was started.

In the second heating step, NH$_3$ was supplied as a constituent gas of the first main flow at 7.5 L/min. Also, nitrogen was supplied as a constituent gas of the second main flow at 37.5 L/min. Subsequently, the temperature of the base was further raised to 1,040° C. by increasing NH$_3$ and nitrogen to 10 L/min. and 90 L/min., respectively. In the second heating step, the flow ratio Fp of the inactive gas component to all the constituent gases of the main flow was 0.83333 at the start of the second heating step, and 0.90 when the growth temperature was reached.

Subsequently, NH$_3$ (10 L/min.) was supplied as a constituent gas of the first main flow. Besides, hydrogen (48 L/min.), nitrogen (12 L/min.), and TMGa (0.0081 L/min. at a concentration of 100%) were supplied as constituent gases of the second main flow, where hydrogen (0.5 L/min.) contained in the main flow was used as a carrier gas to supply the TMGa. Under these conditions of the main flow, an undoped GaN layer (first nitride semiconductor layer) was grown to a thickness of 20 nm (step B). During the growth of the first nitride semiconductor layer, the flow ratio Fa of the active gas component to all the constituent gases of the main flow was 0.82848.

Next, in step C, with the reactor pressure set to 12 kPa, NH$_3$ (10 L/min.) was supplied as a constituent gas of the first main flow. Besides, hydrogen (65 L/min.), nitrogen (15 L/min.), TMGa (0.026 L/min. at a concentration of 100%), and SiH$_4$ ($5 \times 10^{-6}$ L/min. at a concentration of 100%) were supplied as constituent gases of the second main flow, where TMGa was supplied using hydrogen (0.5 L/min.) contained in the main flow, as a carrier gas, and SiH$_4$ was supplied using hydrogen (0.1 L/min.) contained in the main flow, as a diluent gas and using hydrogen (0.4 L/min.) as a carrier gas. Under these conditions of the main flow, a crystal of an n-type GaN layer (second nitride semiconductor layer) was grown to a thickness of 7 µm (step C). During the growth of the second nitride semiconductor layer, the flow ratio Fa of the active gas component to all the constituent gases of the main flow was 0.83310.

Next, with the reactor pressure set to 40 kPa, a multi-quantum well active layer structure was formed by alternately laminating a quantum well layer of In$_{0.07}$Ga$_{0.93}$N (with a thickness of 1.8 nm) with the temperature of the base (substrate temperature) set at 770° C. and a GaN barrier layer (with a thickness of 12 nm) with the temperature of the base (substrate temperature) set at 840° C. for five cycles (step D).

During the growth of the GaN barrier layers, NH$_3$ (10 L/min) was supplied as a constituent gas of the first main flow. Besides, nitrogen (59 L/min.), hydrogen (1 L/min.), and TMGa (0.00007 L/min.) were supplied as constituent gases of the second main flow, where hydrogen (0.5 L/min.) contained in the main flow was used as a carrier gas to supply the TMGa.

During the growth of the $In_{0.07}Ga_{0.93}N$ quantum well layers, $NH_3$ (10 L/min) was supplied as a constituent gas of the first main flow. Besides, nitrogen (60 L/min.), TMGa (0.000045 L/min.), and TMIn (0.001 L/min.) were supplied as constituent gases of the second main flow, where nitrogen contained in the main flow was used as a carrier gas at 0.5 L/min. each to supply the TMGa and TMIn.

During the growth of the multi-quantum well active layer structure, the flow ratio Fp of the inactive gas component to all the constituent gases of the main flow was 0.84286 in the case of the barrier layers, and 0.85713 in the case of the well layers.

Next, with the reactor pressure set to 40 kPa and with the temperature of the base set to 1,000° C., step E was started. In step E, $NH_3$ was supplied as a constituent gas of the first main flow at 10 L/min. Besides, hydrogen (60 L/min.), TMGa (0.0081 L/min.), and $Cp_2Mg$ (0.0001 L/min.) were supplied as constituent gases of the second main flow, where hydrogen contained in the main flow was used as a carrier gas at 0.5 L/min. each to supply the TMGa and $Cp_2Mg$. Under these conditions of the main flow, an Mg-doped GaN layer was grown to 150 nm (step E). During the growth of the Mg-doped GaN layer, the flow ratio Fa of the active gas component to all the constituent gases of the main flow was 0.99988.

When the growth steps were finished, the substrate temperature was lowered and the gases in the reactor were completely replaced with $N_2$. Then, the substrate was taken out and evaluated.

The surface of the substrate thus fabricated looked good although there were slight irregularities. When the surface was measured with a surface roughness gage, Ra was 9.8 nm. Also, when measured under excitation by a laser beam with a wavelength of 325 nm, the peak wavelength of the PL spectrum was 405 nm and integrated intensity of the PL spectrum was 45 in relative value, which was acceptable although a little low.

Example 8

In the present example, a stack of gallium nitride-based semiconductor thin films was grown by the MOCVD process and a blue-color LED was fabricated. A series of crystal growth processes for that has already been outlined with reference to FIG. 2(A). Also, a layer structure after growth is schematically shown in FIG. 3(A).

The base used was a (0001)-oriented (c+ oriented) freestanding GaN substrate 2 inches in diameter. The substrate was n-type and carrier concentration was $1.4 \times 10^{17}$ $cm^{-3}$. The full-width at half maximum of a (10-12) X-ray reflection rocking curve was 89.8 arcsec., OFF angle in the (1-100) direction was 0.88 degrees, and OFF angle in the (11-20) direction was 0.04 degrees. Also, the dislocation density was $5.6 \times 10^6$ $cm^{-2}$. The (0001)-oriented freestanding GaN substrate was placed on a quartz tray (susceptor) in a horizontal quartz reactor which normally operates under conditions of normal pressure. The pressure in the reactor was $100\pm2$ kPa in all steps.

First, in the first heating step $t_B$, the base was heated by supplying $N_2$ as a main flow into the reactor at 10 L/min. When the temperature of the base reached 500° C., the second heating step $t_A$ was started. In the second heating step, $NH_3$ was supplied as a constituent gas of the first main flow at 7.5 L/min. and $N_2$ was supplied as a constituent gas of the second main flow at 12.5 L/min.

Subsequently, the substrate temperature was further raised to 1,000° C. by increasing $NH_3$ and $N_2$ to 10 L/min. and 30 L/min., respectively. Meanwhile, a subflow of $N_2$ gas was supplied at 20 L/min. and a non-growth-related flow of $N_2$ was supplied for purge and other purposes at 19 L/min. in total. In the second heating step, the flow ratio Fp of the inactive gas component to all the constituent gases of the main flow was 0.625 at the start of the second heating step, and 0.75 when the growth temperature was reached.

Next, in step B, $NH_3$ was supplied as a constituent gas of the first main flow at 10 L/min. As constituent gases of the second main flow, $N_2$ was supplied at 20 L/min. and $H_2$ was supplied at 15 L/min. Also, TMGa (0.0018 L/min. at a concentration of 100%) was supplied into the reactor using $H_2$ (0.5 L/min.) contained in the main flow, as a carrier gas. By supplying these main flow gases, an undoped GaN layer (first nitride semiconductor layer) was grown to a thickness of 40 nm. Meanwhile, a gas mixture (20.5 L/min.) of $NH_3$ (0.5 L/min.) and $N_2$ (20 L/min.) was supplied as a subflow. Also, a non-growth-related flow of $N_2$ was supplied for purge and other purposes at 19 L/min. During the growth of the first nitride semiconductor layer, the flow ratio Fp of the inactive gas component to all the constituent gases of the main flow was 0.55553.

Next, in step C, $NH_3$ was supplied as a constituent gas of the first main flow at 10 L/min. As constituent gases of the second main flow, $N_2$ was supplied at 20 L/min. and $H_2$ was supplied at 10 L/min. Also, TMGa (at 0.0055 L/min. at a concentration of 100%) was supplied into the reactor using $H_2$ (0.5 L/min.) contained in the main flow, as a carrier gas, and $SiH_4$ (at $6 \times 10^{-7}$ L/min. at a concentration of 100%) was supplied into the reactor using $H_2$ (0.2 L/min.) contained in the main flow, as a carrier gas and using $H_2$ (0.06 L/min.) as a diluent gas. By supplying these main flow gases, an Si-doped GaN layer (second nitride semiconductor layer) was grown to a thickness of 7 μm. Meanwhile, a gas mixture (25.5 L/min.) of $NH_3$ (0.5 L/min.) and $N_2$ (25 L/min.) was supplied as a subflow. Also, a non-growth-related flow of $N_2$ was supplied for purge and other purposes at 19 L/min. During the growth of the second nitride semiconductor layer, the flow ratio Fp of the inactive gas component to all the constituent gases of the main flow was 0.55549.

Next, the temperature of the base (substrate temperature) was set to 740° C. When the substrate temperature was stabilized sufficiently, a multi-quantum well active layer structure was formed by laminating a quantum well layer of $In_{0.14}Ga_{0.86}N$ (with a thickness of 1.8 nm) and a GaN barrier layer (with a thickness of 15 nm) alternately for eight cycles (step D). To grow the quantum well layers of $In_{0.14}Ga_{0.86}N$, $NH_3$ (10 L/min.) was used as a constituent gas of the first main flow. $N_2$ (20 L/min.), TMGa (0.000015 L/min.), and TMIn (0.00023 L/min.) were supplied as constituent gases of the second main flow, where $N_2$ contained in the main flow was used as a carrier gas at 0.5 L/min. each to supply the TMGa and TMIn.

To grow the GaN barrier layers, $NH_3$ (10 L/min.) was used as a constituent gas of the first main flow. $N_2$ (18.5 L/min.), $H_2$ (1.5 L/min.), and TMGa (0.000017 L/min.) were supplied as constituent gases of the second main flow, where $H_2$ (0.5 L/min.) contained in the main flow was used as a carrier gas to supply the TMGa.

In step D, a gas mixture of $NH_3$ (0.5 L/min.) and $N_2$ (25 L/min.) was supplied as a subflow at 25.5 L/min. Also, a non-growth-related flow of $N_2$ was supplied for purge and other purposes at 19 L/min. During the growth of the multi-quantum well active layer structure, the flow ratio Fp of the inactive gas component to all the constituent gases of the main flow was 0.66666 in the case of the InGaN well layers, and 0.61667 in the case of the GaN barrier layers.

Next, the substrate temperature was set to 1,000° C. and an Mg-doped $Al_{0.1}Ga_{0.9}N$ layer 50 nm thick was formed (step E). NH$_3$ (10 L/min.) was used as a constituent gas of the first main flow. H$_2$ (80 L/min.), TMAl (0.0001 L/min.), TMGa (0.0018 L/min.), and Cp$_2$Mg (4×10$^{-6}$ L/min.) were used as constituent gases of the second main flow, where H$_2$ contained in the main flow was used as a carrier gas at 0.5 L/min. each to supply the TMAl, TMGa, and Cp$_2$Mg.

An Mg-doped GaN layer 70 nm thick was epitaxially grown further on the Mg-doped Al$_{0.1}$Ga$_{0.9}$N layer (step E). The GaN layer was grown by stopping the supply of TMAl and H$_2$ (50 L/min.) out of the main flow gases described above.

In step E, during the growth of the Al$_{0.1}$Ga$_{0.9}$N layer, a gas mixture of NH$_3$ (0.5 L/min.) and N$_2$ (50 L/min.) was supplied as a subflow at 50.5 L/min. Also, a non-growth-related flow of N$_2$ (19 L/min) was supplied for purge and other purposes. During the growth of the Mg-doped Al$_{0.1}$Ga$_{0.9}$N layer, the flow ratio Fp of the inactive gas component to all the constituent gases of the main flow was 0.

Also, in step E, during the growth of the Mg-doped GaN layer, a gas mixture of NH$_3$ (0.5 L/min.) and N$_2$ (20 L/min.) was supplied as a subflow at 20.5 L/min. Also, a non-growth-related flow of N$_2$ (19 L/min) was supplied for purge and other purposes. During the growth of the Mg-doped GaN layer, the flow ratio Fp of the inactive gas component to all the constituent gases of the main flow was 0.

When the growth steps were finished, the substrate temperature was lowered and the gases in the reactor were completely replaced with N$_2$. Then, the substrate was taken out and evaluated.

The surface of the substrate thus fabricated was good although there were slight irregularities. The surface was measured with a contact-type surface roughness gage to determine center line average roughness (Ra). As a result, Ra according to the present example was 11 nm. Also, when PL characteristics were measured under excitation by a laser beam with a wavelength of 325 nm, the peak wavelength was 466 nm, integrated intensity of the PL characteristics was 20 in relative value, which was acceptable although a little low.

Comparative Example 1

In the present comparative example, a near ultraviolet LED was fabricated using almost the same steps as in Example 3, but the present comparative example differed from Example 3 in the thickness of the first nitride semiconductor layer and second nitride semiconductor layer as well as in reactor atmosphere used in the growth steps of the first nitride semiconductor layer and second nitride semiconductor layer.

The base used was a (0001)-oriented (c+ oriented) freestanding GaN substrate. The substrate was n-type and carrier concentration was 3.5×10$^{17}$ cm$^{-3}$. The full-width at half maximum of a (10-12) X-ray reflection rocking curve was 87 arcsec., OFF angle in the (1-100) direction was −0.24 degrees, and OFF angle in the (11-20) direction was 5.25 degrees. Also, the dislocation density was 8.3×10$^6$ cm$^{-2}$. The same crystal growth apparatus and heating steps as in Example 3 were used.

Next, in step B, NH$_3$ (10 L/min) was supplied as a constituent gas of the first main flow. Besides, nitrogen (29.5 L/min.), hydrogen (0.5 L/min.), and TMGa (0.0018 L/min. at a concentration of 100%) were supplied as constituent gases of the second main flow, where hydrogen contained in the main flow was used as a carrier gas to supply the TMGa. Under these conditions of the main flow, an undoped GaN layer (first nitride semiconductor layer) was grown to a thickness of 20 nm (step B). During the growth of the first nitride semiconductor layer, the flow ratio Fa of the active gas component to all the constituent gases of the main flow was 0.26249.

Next, in step C, NH$_3$ (10 L/min.) was supplied as a constituent gas of the first main flow. Besides, nitrogen (39.3 L/min.), hydrogen (0.5 L/min.), TMGa (0.0055 L/min. at a concentration of 100%), and SiH$_4$ (6×10$^{-7}$ L/min. at a concentration of 100%) were supplied as constituent gases of the second main flow, where TMGa was supplied using hydrogen contained in the main flow, as a carrier gas, and SiH$_4$ was supplied using hydrogen (0.2 L/min.) contained in the main flow as a carrier gas and using hydrogen (0.06 L/min.), as a diluent gas.

Under these conditions of the main flow, a crystal of an n-type GaN layer (second nitride semiconductor layer) was grown to a thickness of 2 μm (step C). During the growth of the second nitride semiconductor layer, the flow ratio Fa of the active gas component to all the constituent gases of the main flow was 0.21518.

All the subsequent steps were the same as in Example 3.

The surface of the substrate thus fabricated had severe irregularities. When the surface was measured with a surface roughness gage, Ra was 444.9 nm. Also, when measured under excitation by a laser beam with a wavelength of 325 nm, the peak wavelength of the PL spectrum was 414 nm, which was longer than 387 nm in Example 3. The integrated intensity of the PL spectrum was 1 in relative value, which was extremely low.

Comparative Example 2

In the present comparative example, a near ultraviolet LED was fabricated using almost the same steps as in Example 3, but the present comparative example used a higher flow ratio Fa of active gas in the second heating step.

The base used was a (0001)-oriented (c+ oriented) freestanding GaN substrate. The substrate was n-type and carrier concentration was 3.2×10$^{17}$ cm$^{-3}$. The full-width at half maximum of a (10-12) X-ray reflection rocking curve was 92 arcsec., OFF angle in the (1-100) direction was −0.06 degrees, and OFF angle in the (11-20) direction was 0.21 degrees. Also, the dislocation density was 5.4×10$^6$ cm$^{-2}$.

The pressure in the reactor was 100±2 kPa in all steps. First, in the first heating step, the base was heated by supplying H$_2$ as a main flow into the reactor at 10 L/min. When the temperature of the base reached 500° C., the second heating step was started. NH$_3$ (7.5 L/min.) was supplied as a constituent gas of the first main flow and H$_2$ (12.5 L/min.) was supplied as a constituent gas of the second main flow. Subsequently, the substrate temperature was further raised to a final attainable temperature of 1,000° C. by increasing NH$_3$ and H$_2$ to 10 L/min. and 30 L/min., respectively. In the second heating step, the flow ratio Fp of the inactive gas component to all the constituent gases of the main flow was 0.

Next, in step B, NH$_3$ (10 L/min.) was supplied as a constituent gas of the first main flow. Also, hydrogen (30 L/min.) and TMGa (0.0018 L/min. at a concentration of 100%) were supplied as constituent gases of the second main flow, where hydrogen (0.5 L/min.) contained in the main flow was used as a carrier gas to supply the TMGa. Under these conditions of the main flow, an undoped GaN layer (first nitride semiconductor layer) was grown to a thickness of 100 nm (step B). During the growth of the first nitride semiconductor layer, the flow ratio Fa of the active gas component to all the constituent gases of the main flow was 0.99996.

Next, TMGa (0.0055 L/min. at a concentration of 100%) was supplied using hydrogen (0.5 L/min.) contained in the main flow, as a carrier gas, and SiH$_4$ (6×10$^{-7}$ L/min. at a concentration of 100%) was supplied using hydrogen (0.2 L/min.) contained in the main flow, as a carrier gas and using hydrogen (0.6 L/min.) as a diluent gas. Under these conditions, a crystal of an n-type GaN layer (second nitride semiconductor layer) was grown to a thickness of 5 μm (step C). During the growth of the second nitride semiconductor layer, the flow ratio Fa of the active gas component to all the constituent gases of the main flow was 0.99989.

All the subsequent steps were carried out in the same manner as in Example 3.

The surface of the substrate thus fabricated was extremely flat. When the surface was measured with a surface roughness gage, Ra was 5.5 nm. Also, when measured under excitation by a laser beam with a wavelength of 325 nm, the integrated intensity of the PL spectrum was 1 in relative value, which was extremely low.

Comparative Example 3

In the present comparative example, a blue-color LED was fabricated using almost the same steps as in Example 5, but the present comparative example differed from Example 5 in that SiH$_4$ was introduced as a Si source material during the growth of the first nitride semiconductor layer.

The base used was a (0001)-oriented (c+ oriented) free-standing GaN substrate. The substrate was n-type and carrier concentration was $3.2 \times 10^{17}$ cm$^{-3}$. The full-width at half maximum of a (10-12) X-ray reflection rocking curve was 92 arcsec. The same crystal growth apparatus and heating steps as in Example 5 were used.

In step B, NH$_3$ (5 L/min.) was supplied as a constituent gas of the first main flow. Besides, hydrogen (15 L/min.), TMGa (0.0022 L/min. at a concentration of 100%) which was part of the main flow, and SiH$_4$ ($6 \times 10^{-8}$ L/min. at a concentration of 100%) were supplied as constituent gases of the second main flow, where hydrogen (0.2 L/min.) contained in the main flow was used as a diluent gas for the SiH$_4$. Under these conditions of the main flow, an n-type GaN layer (first nitride semiconductor layer) was grown to a thickness of 40 nm (step B). During the growth of the first nitride semiconductor layer, the flow ratio Fa of the active gas component to all the constituent gases of the main flow was 0.99989.

Next, the reactor pressure was set to 8 kPa and step C was started. NH$_3$ (10 L/min.) was supplied as a constituent gas of the first main flow. Besides, hydrogen (9.8 L/min.), nitrogen (2.7 L/min.), TMGa (0.0071 L/min. at a concentration of 100%), and SiH$_4$ ($6 \times 10^{-7}$ L/min. at a concentration of 100%) were supplied as constituent gases of the second main flow, where TMGa was supplied using hydrogen (0.5 L/min.) contained in the main flow, as a carrier gas, and SiH$_4$ was supplied using nitrogen (0.2 L/min.) contained in the main flow, as a diluent gas.

Under these conditions of the main flow, a crystal of an n-type GaN layer (second nitride semiconductor layer) was grown to a thickness of 7 μm (step C). During the growth of the second nitride semiconductor layer, the flow ratio Fa of the active gas component to all the constituent gases of the main flow was 0.87972.

All the subsequent steps were carried out in the same manner as in Example 5.

The surface of the substrate thus fabricated had marked irregularities and poor flatness. When the surface was measured with a surface roughness gage, Ra was 20.9 nm. Also, when measured under excitation by a laser beam with a wavelength of 325 nm, the peak wavelength of the PL spectrum was 460 nm and integrated intensity of the PL spectrum was 4 in relative value, which was extremely low.

Reference Example 1

SIMS (secondary ion mass spectrometry) was conducted to actually measure Si concentrations in the undoped GaN layer (GaN layer not intentionally doped with Si) and the Si-doped GaN layer in each of the above examples as well as Si concentrations in the corresponding layers in the comparative examples, where the undoped GaN layer is the first nitride semiconductor layer and the Si-doped GaN layer is the second nitride semiconductor layer.

The background discrimination of the mass spectrometer was $1 \times 10^{16}$ cm$^{-3}$, meaning that the mass spectrometer was capable of measuring Si content in excess of this value. However, the thickness up to which Si concentrations in a stack of different nitride layers can be measured accurately needs to be determined by taking into consideration: the fact that samples are analyzed by ion milling in the thickness direction and the fact, especially in this case, that Si concentrations are intended to be measured both in a layer with a high Si concentration on the front side and in an adjacent layer with a low Si concentration.

Actually, it is preferable that the thickness of the low-concentration layer is approximately 150 nm or above from the standpoint of measurement accuracy. Therefore, regarding various samples for SIMS analysis, growth times in the first growth step and second growth step were changed among various growth conditions in the heating step, first growth step, and second growth step in examples and comparative examples, the thicknesses of the first nitride semiconductor layer and second nitride semiconductor layer were set so as to enable accurate SIMS measurements, and samples were taken out after an appropriate cooling period in the second growth step. Otherwise the samples for SIMS measurements were prepared in the same manner as in the examples and comparative examples described above.

Table 2 summarizes SIMS measurement results of the samples, where figures in the table are Si concentrations whose unit is cm$^{-3}$.

TABLE 2

| Growth conditions followed | Example 1 | Example 3 | Example 6 | Comparative Example 1 | Comparative Example 3 |
|---|---|---|---|---|---|
| First nitride semiconductor layer | $4.7 \times 10^{16}$ | $6.7 \times 10^{16}$ | $1.9 \times 10^{16}$ | $4.9 \times 10^{16}$ | $4.0 \times 10^{17}$ |
| Second nitride semiconductor layer | $2.2 \times 10^{18}$ | $2.5 \times 10^{18}$ | $5.8 \times 10^{18}$ | $5.0 \times 10^{18}$ | $5.9 \times 10^{18}$ |

Examples, comparative examples, and a reference example have been described above, and based on comparisons among them, the present inventors interpret the results as follows. Specifically, in Comparative Example 1, the Fa in the first growth step was too low, resulting in deteriorated surface morphology. In Comparative Example 1, the Fa in the second heating step was too low, causing defects to be introduced, which in turn deteriorated the PL characteristics greatly. In Comparative Example 3, intentional doping in step B caused growth inhibition, resulting in an extremely deteriorated surface.

Also, the present inventors understand differences between the present invention and the inventions disclosed in the prior literature listed above as follows.

The crystal growth method described in patent document 1 (invention in patent document 1) differs from the present invention in that according to the invention in patent document 1: (1) hydrogen is used as the atmosphere (constituent gas of the main flow) in the heating step before the nitride semiconductor layer is grown, (2) the reactor pressure is greatly reduced in the initial stage of the growth of the nitride semiconductor layer, (3) a Si source material ($SiH_4$) is introduced from the start of growth of the nitride semiconductor layer.

However, because of the etching effect, hydrogen gas induces removal of nitrogen atoms from near the surface, causing introduction of defects into the surface of the nitride semiconductor, and thereby inducing tremendous deterioration in crystallinity. Also, although reactor pressure suitable for crystal growth of a nitride semiconductor varies slightly depending on configuration of the reactor used, according to studies conducted by the present inventors, a reactor pressure of about 30 kPa is too low and still induces removal of nitrogen atoms. Furthermore, part of $SiH_4$ causes vapor phase reactions, and products of the reactions, if attach to the substrate surface, act as constraints on crystal growth, whose impact is quite noticeable in the initial stage of crystal growth.

On the other hand, with the crystal growth method described in patent document 2 (invention in patent document 2), the initial growth layer of nitride semiconductor layers is an undoped layer which does not contain Si, as in the case of the present invention. Although an undoped layer is less subject to growth inhibition effect of Si source material, the initial growth layer is as thick as 1 μm (see paragraph 32), and according to studies conducted by the present inventors, such a thick undoped layer formed on an active layer can cause reduction in luminous intensity.

The present invention is intended to solve the above problems with the conventional methods and provide a high-quality nitride semiconductor characterized by good surface morphology and optical characteristics as well as high luminous efficiency when used as a light-emitting element.

The present invention has been described above by way of examples, but the examples described above are intended to be merely exemplary of the present invention and not restrictive thereof. The GaN used for the p-type layer in the examples may be substituted with AlN, InN, or BN or a mixed crystal thereof. Also, the growth temperatures, supplies of raw materials, film thicknesses of layers, and the like may be changed according to purpose.

The base used may be a sapphire substrate, ZnO substrate, Si substrate, SiC substrate, GaAs substrate, GaP substrate, $Ga_2O_3$ substrate, Ge substrate, or MgO substrate with a film of nitride crystal formed thereon. It is self-evident from the above description that various changes to the above examples are within the scope of the present invention and that various examples are possible within the scope of the present invention.

Example 9

Figure 2B:
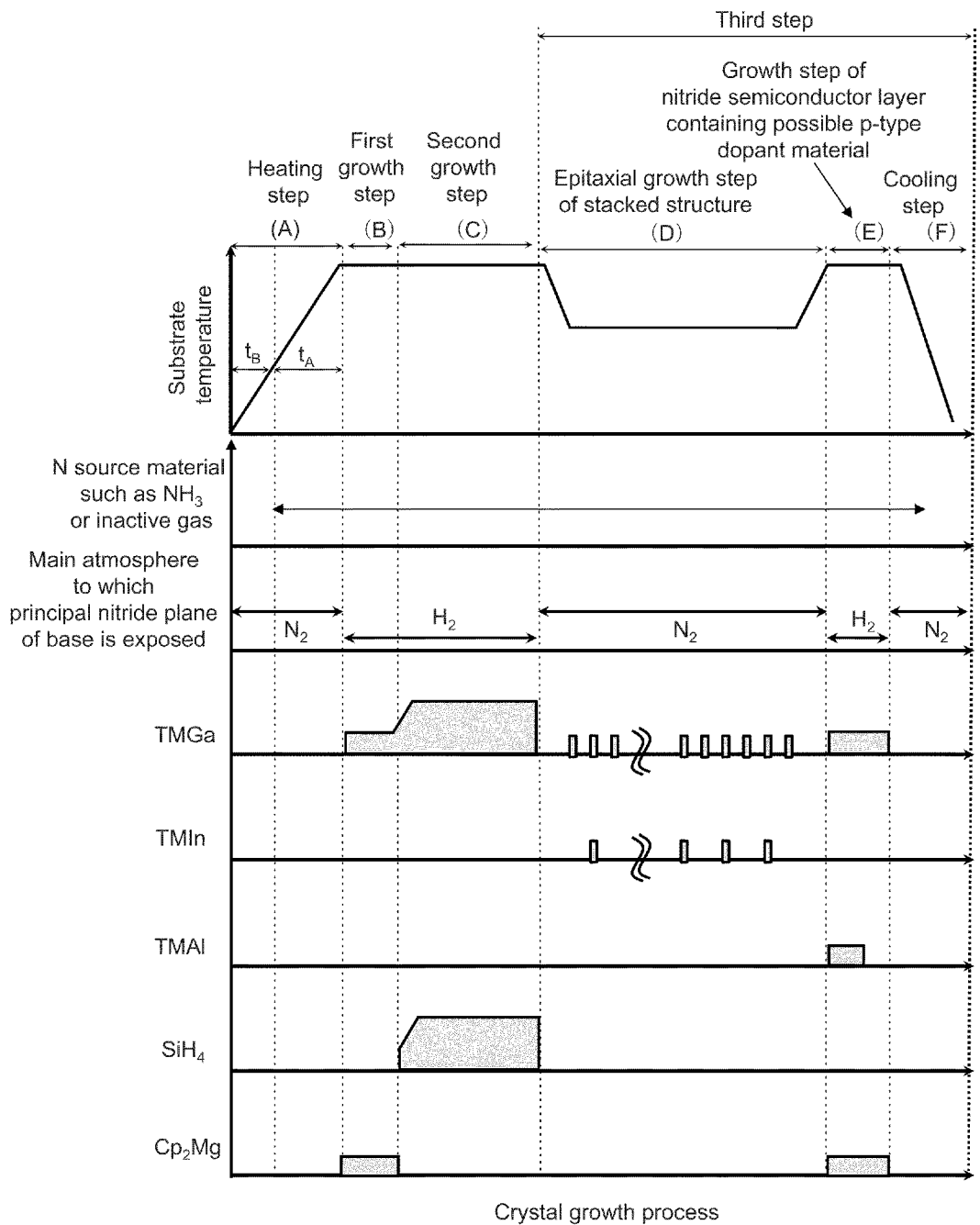
FIG. 2(B) is a diagram for illustrating an exemplary sequence of a nitride semiconductor crystal growth method according to Example 9.
Figure 3B:
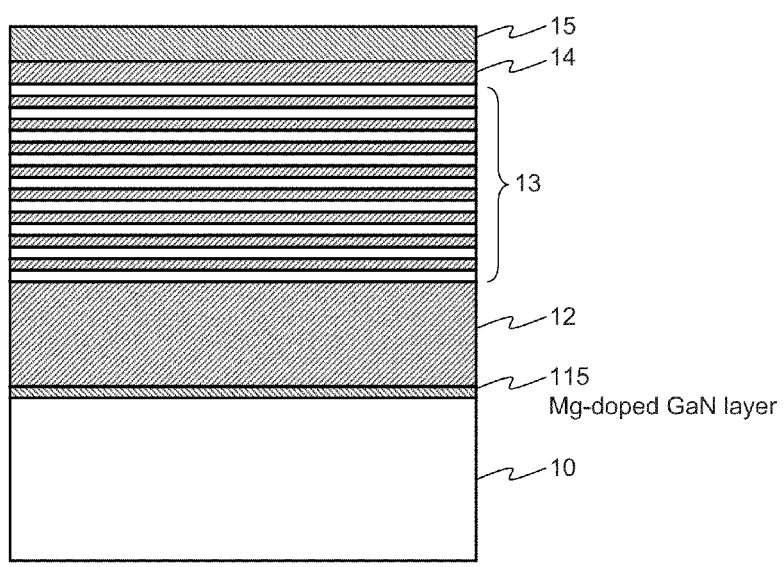
FIG. 3(B) is a simplified sectional view for illustrating an example of a nitride semiconductor according to Example 9.

In the present example, a stack of gallium nitride-based semiconductor thin films was grown by the MOCVD process and a near ultraviolet LED was fabricated. A series of crystal growth processes for that has already been outlined with reference to FIG. 2(B). Also, a layer structure after growth is schematically shown in FIG. 3(B).

The base used was a (0001)-oriented (c+ oriented) freestanding GaN substrate. The substrate was n-type and carrier concentration was $2.5 \times 10^{17}$ $cm^{-3}$. The full-width at half maximum of a (10-12) X-ray reflection rocking curve was 64 arcsec., OFF angle in the (1-100) direction was 0.19 degrees, and OFF angle in the (11-20) direction was 0.20 degrees. Also, the dislocation density was $5.1 \times 10^6$ $cm^{-2}$. The (0001)-oriented freestanding GaN substrate was placed on a tray (susceptor) in a horizontal quartz reactor which normally operates under conditions of normal pressure. The pressure in the reactor was 100±2 kPa in all steps.

The first and second heating steps were carried out in the same manner as in Example 3.

Next, in step B, $NH_3$ (10 L/min.) was supplied as a constituent gas of the first main flow. Besides, $H_2$ (30 L/min.), TMGa (0.0018 L/min. at a concentration of 100%), and $Cp_2Mg$ ($4 \times 10^{-6}$ L/min.) were supplied into the reactor as constituent gases of the second main flow, where $H_2$ contained in the main flow was used as a carrier gas at 0.5 L/min. each to supply the TMGa and $Cp_2Mg$. Under these conditions of the gas supplied in the main flow, an Mg-doped GaN layer (first nitride semiconductor layer) was grown to a thickness of 40 nm (step B). Meanwhile, a gas mixture (20.5 L/min.) of $NH_3$ (0.5 L/min.) and $N_2$ (20 L/min.) was supplied as a subflow. Also, a non-growth-related flow of $N_2$ was supplied for purge and other purposes at 19 L/min. During the growth of the first nitride semiconductor layer, the flow ratio Fa of the active gas component to all the constituent gases of the main flow was 0.99996.

Subsequently, steps C to E were carried out in the same manner as in Example 3.

When the growth steps were finished, the substrate temperature was lowered and the gases in the reactor were completely replaced with $N_2$. Then, the substrate was taken out and evaluated.

The surface of the substrate thus fabricated had good flatness although there were very slight irregularities. The surface was measured with a contact-type surface roughness gage to determine center line average roughness (Ra) which is an index of irregularity. As a result, Ra according to the present example was 7.8 nm. Also, when PL characteristics were measured under excitation by a laser beam with a wavelength of 325 nm, the peak wavelength was 400 nm and integrated intensity of the PL characteristics was 68 in relative value, indicating a high intensity.

Example 10

In the present example, a stack of gallium nitride-based semiconductor thin films was grown by the MOCVD process and a near ultraviolet LED was fabricated. A series of crystal growth processes for that has already been outlined with reference to FIG. 2(A). Also, a layer structure after growth is schematically shown in FIG. 3(A).

The base used was a (0001)-oriented (c+ oriented) freestanding GaN substrate. The substrate was n-type and carrier concentration was $1.9 \times 10^{17}$ $cm^{-3}$. The full-width at half maximum of a (10-12) X-ray reflection rocking curve was 55 arcsec., OFF angle in the (1-100) direction was 0.16 degrees, and OFF angle in the (11-20) direction was 0.04 degrees. Also, the dislocation density was $5.0 \times 10^6$ $cm^{-2}$. The (0001)-oriented freestanding GaN substrate was placed on a tray (susceptor) in a horizontal quartz reactor which normally operates under conditions of normal pressure.

Step A, i.e., the heating step, was carried out in the same manner as in Example 3.

Step B next was carried out in the same manner as in Example 3 except that the thickness of the first nitride semiconductor layer was 40 nm.

Subsequently, steps C to E were carried out in the same manner as in Example 3.

When the growth steps were finished, TMGa and Cp$_2$Mg as well as H$_2$ in the main flow were cut off and N$_2$ was introduced at 20 slm. At the same time, the flow rate of NH$_3$, which was 10 slm during growth, was reduced to 200 sccm at the initial stage of the cooling step. Also, NH$_3$ in the subflow was cut off and the N$_2$ flow rate was set to 10 slm. The non-growth-related flow was not changed.

Simultaneously with the gas supply changes, the heater power was shut off and the substrate was cooled forcibly by introducing gas. When the substrate temperature was lowered to 930° C., the NH$_3$ in the main flow was cut off and the substrate was cooled in the NH$_3$ atmosphere until the substrate temperature reaches or falls below 100° C. When the substrate was cooled sufficiently, the substrate was taken out and evaluated.

The surface of the substrate thus fabricated had good flatness although there were very slight irregularities. The surface was measured with a contact-type surface roughness gage to determine center line average roughness (Ra) which is an index of irregularity. As a result, Ra according to the present example was 9.8 nm. Also, when PL characteristics were measured under excitation by a laser beam with a wavelength of 325 nm, the peak wavelength was 408 nm, integrated intensity of the PL characteristics was 56 in relative value, indicating a high intensity.

Subsequently, the epitaxial layer on a nonpolar plane prepared by the above method was processed into an LED. Both light emission characteristics and current-voltage characteristics of the LED were good, which confirmed that the in-process activation step during cooling enabled good optical characteristics and sufficient Mg activation.

Example 11

Figure 8:
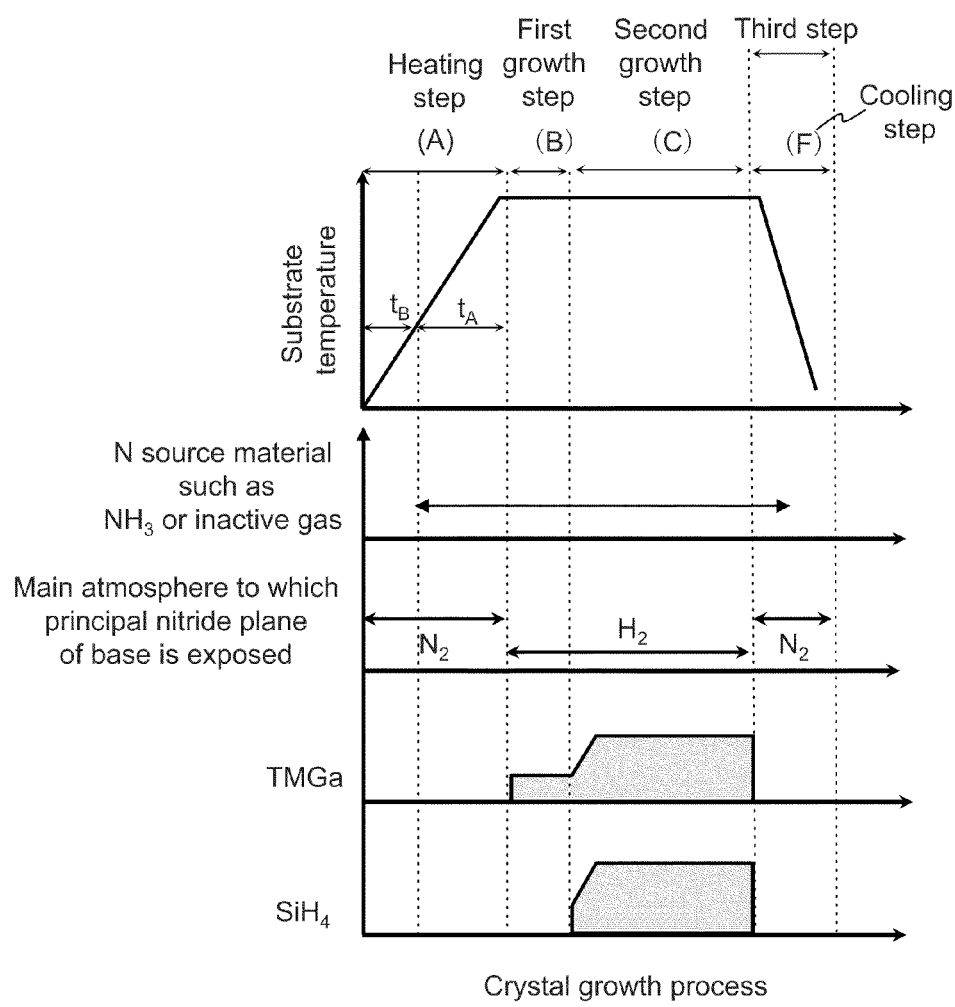
FIG. 8 is a diagram for illustrating an exemplary sequence of a nitride semiconductor crystal growth method according to Example 11.
Figure 9:
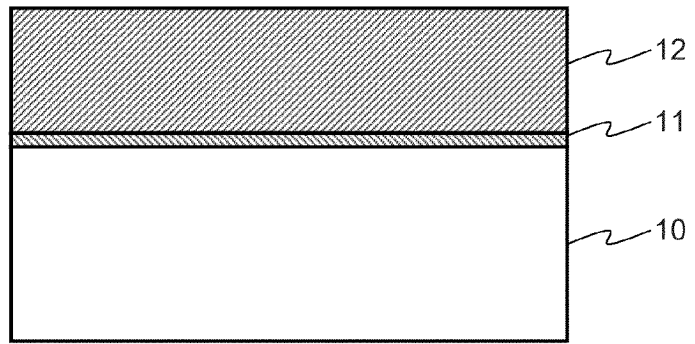
FIG. 9 is a simplified sectional view for illustrating an example of a nitride semiconductor according to Example 11.

In the present example, a stack of gallium nitride-based semiconductor thin films was grown by the MOCVD process. A series of crystal growth processes will be outlined with reference to FIG. 8. Also, a layer structure after growth is schematically shown in FIG. 9.

The base used was a (0001)-oriented (c+ oriented) freestanding GaN substrate. The substrate was n-type and carrier concentration was $1.4 \times 10^{17}$ cm$^{-3}$. The full-width at half maximum of a (10-12) X-ray reflection rocking curve was 81.2 arcsec., OFF angle in the (1-100) direction was 0.25 degrees, and OFF angle in the (11-20) direction was 0.09 degrees. Also, the dislocation density was $5.2 \times 10^6$ cm$^{-2}$. The (0001)-oriented freestanding GaN substrate was placed on a quartz tray (susceptor) in a horizontal quartz reactor which normally operates under conditions of normal pressure. The pressure in the reactor was 100±2 kPa in all steps.

Step A, i.e., the heating step, was carried out in the same manner as in Example 3.

Step B was carried out in the same manner as in Example 3.

Step C was carried out in the same manner as in Example 3.

Steps D and E were omitted.

When the growth steps were finished, the substrate temperature was lowered and the gases in the reactor were completely replaced with N$_2$. Then, the substrate was taken out and evaluated.

The surface of the substrate thus fabricated had good flatness although there were very slight irregularities. The surface was measured with a contact-type surface roughness gage to determine center line average roughness (Ra) which is an index of irregularity. As a result, Ra according to the present example was 6.9 nm.

Cathode-luminescence measurements were made of the epitaxial layers of the freestanding GaN substrate using the procedures described below. Then, dislocation density was determined by counting the number of dark spots obtained by the cathode-luminescence measurements.

Cathode luminescence (CL) is measured by irradiating a specimen with an electron beam. In the case of a scanning type, if electron irradiation position is varied two-dimensionally, it is possible to evaluate luminescence intensity distribution, wavelength distribution, and the like on the irradiated surface in the field of view. Since electron beam energy is sufficiently large compared to the band gap of the specimen, excited states can easily be brought about locally. Therefore, if there is any non-radiative region in the specimen due to crystal defects, the region can be observed clearly by means of contrast in a two-dimensional image of luminescence intensity. It is known that in GaN-based materials, dislocations are observed as dark spots which are discrete non-radiative regions. Furthermore, in CL observations, by varying accelerated electrons in an electron beam, it is possible to adjust penetration depth of electrons into a specimen and thereby acquire information at different depths.

In the CL observations of the nitride semiconductor fabricated in the present example, the acceleration voltage of the electron beam was set to 3 Kv and value of current was set to 100 pA. This level (3 Kv) of acceleration voltage allows information about a region to a depth of approximately 100 nm from the surface to be evaluated separately from an impact of a deeper region. The sample fabricated in the present example was a nitride semiconductor having a structure in which the first nitride semiconductor layer and second nitride semiconductor layer were stacked onto a freestanding GaN substrate. With this structure, when the nitride semiconductor is observed using an electron beam entering through the surface of the second nitride semiconductor layer, judging from the thickness of the sample and penetration depth of the electron beam, it can be said that what is observed is dislocation information about the second nitride semiconductor layer.

Also, in the CL observations, the luminescence excited by the electron beam was received by a photomultiplier tube without spectral analysis and converted into intensity information for observation. That is, the dislocation density was derived through-observation of a so-called panchromatic image.

In the CL observations, a region of 60 μm×45 μm was observed at multiple sites at a magnification of 2,000. When the number of dark spots was determined from panchromatic CL images, there were variations in the number of dark spots among the observed sites. As a result, the number of dark spots was 265 at its maximum, 164 on average, and 68 at its minimum.

Thus, the density of dark spots, which varied with the site, was $9.8 \times 10^6$ cm$^{-2}$ at its maximum, $6.1 \times 10^6$ cm$^{-2}$ on average, and $2.5 \times 10^6$ cm$^{-2}$ at its minimum. These values corresponded to the dislocation density in the second nitride semiconductor layer.

Example 12

In the present example, in the LED structure which, having been fabricated in Example 3, emits near ultraviolet light, dislocations in the active layer structure formed on a c-plane GaN substrate were observed using ultra high-voltage transmission electron microscopy. The high-voltage transmission electron microscopy was used to observe the dislocations in the active region because it was difficult with the CL technique used in Example 11 to observe dislocations in an active region, in particular, due to light emission from the active layer itself.

First, high-voltage transmission electron microscopy will be described additionally. General-purpose transmission electron microscopy (TEM) uses an acceleration voltage of about 100 to 400 kV, but an acceleration voltage of this magnitude provides effective penetrating ability of electrons on the order of a few hundred nm at the most, which restricts observation of expected crystal defects and dislocations in epitaxial layers on GaN substrates.

Reasons for that are as follows. In homoepitaxial growth of GaN-based material on a GaN substrate, if proper epitaxial growth is realized after sufficient examination, it is considered essentially possible to reduce dislocations. Thus, in observation of crystal defects and dislocations, it is necessary to create a specimen having reasonable "thickness" so that dislocations will come into the observation field of view even if the specimen has a low dislocation density. To observe a specimen with such a thickness under a TEM, an electron accelerating voltage of 1,000 kV or above is required for observation.

When such an electron accelerating voltage is used, observable specimen thickness can be increased to about 1 to 2 μm. This makes it possible to observe dislocations even in the case of a sample with a low dislocation density such as described above. If dislocation lines cannot be observed even when a specimen with such a thickness is observed, it is likely that the dislocation density of the specimen has been reduced considerably.

Specifically, if dislocations are not observed when a sample with a thickness on the order of a few hundred nm at the most is observed in an area as large as the field of view, this only means that the dislocation density is on the order of approximately 10 to the eighth power ($cm^{-2}$). On the other hand, if dislocations are not observed even when a specimen whose thickness is increased to about 1 to 2 μm is observed in an area as large as the field of view, this means that the specimen has a dislocation density lower than approximately 10 to the seventh power ($cm^{-2}$) at the most.

Furthermore, dislocations may be unobservable depending on the incident direction of an electron beam. Thus, preferably the incident electron beam is adjusted to be parallel to the M-axis direction when, for example, a GaN layer on a c-plane substrate is observed.

In view of the above circumstances, for TEM observations in the present example, an ultra high-voltage TEM with an effective penetrating ability in excess of 1 μm was used with the acceleration voltage of the electron beam set to 1,000 Kv. The specimen thickness was approximately 1.0 μm and the incident electron beam was parallel to the M-axis direction. Incidentally, the ultra high-voltage TEM used was JEM-ARM1000 made by JEOL Ltd.

Figure 10:
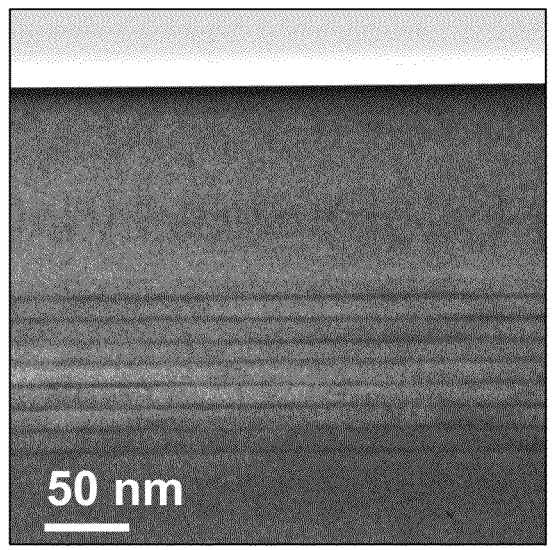
FIG. 10 is a diagram showing an ultra high-voltage TEM image obtained by observing a nitride semiconductor according to Example 12.

Specifically, an area measuring 12.6 μm along the substrate surface was observed and that a thin section placed in the observation field of view was 1.0 μm thick. Multiple sites in the sample each as large as the observation field of view were observed via transmission of a 1,000-kV electron beam. An example of results is shown in FIG. 10. As illustrated in FIG. 10, no dislocation propagating in the C-axis direction was observed.

However, since the dislocation density in the surface of the second semiconductor layer was $9.8 \times 10^6$ $cm^{-2}$ at its maximum, $6.1 \times 10^6$ $cm^{-2}$ on average, and $2.5 \times 10^6$ $cm^{-2}$ at its minimum as a result of CL measurements in Example 11, it is considered that the active layer stacked on the second semiconductor layer can have a similar degree of dislocation density. That is, it will be safe to assume that the upper limit of dislocation density in the active layer is at a level similar to the dislocation density in the surface of the second semiconductor layer.

Thus, according to the present invention, preferably the dislocation density in the active layer is $1.0 \times 10^7$ $cm^{-2}$ or below, more preferably $6.5 \times 10^6$ $cm^{-2}$ or below, and still more preferably $3.0 \times 10^6$ $cm^{-2}$.

On the other hand, when the results of high-voltage transmission electron microscopy are interpreted literally, according to the present invention, most preferably the dislocation density in the active layer is less than 100 or as close to zero as possible.

Reference Example 2

In reference Example 1, Si concentrations were actually measured in relatively thick layers fabricated: a GaN layer not intentionally doped with Si (first nitride semiconductor layer) and a Si-doped GaN layer (second nitride semiconductor layer). On the other hand, in the present reference example, Si concentrations in relatively thin layers were evaluated by SIMS analysis.

The substrate evaluated this time contained an LED structure described below. A series of crystal growth processes for that has already been outlined with reference to FIG. 2(A). Also, a layer structure after growth is schematically shown in FIG. 3(A).

The base used was a (0001)-oriented (c+ oriented) freestanding GaN substrate. The substrate was n-type and carrier concentration was $1.8 \times 10^{17}$ $cm^{-3}$. The full-width at half maximum of a (10-12) X-ray reflection rocking curve was 60.0 arcsec., OFF angle in the (1-100) direction was 0.16 degrees, and OFF angle in the (11-20) direction was 0.29 degrees. Also, the dislocation density was $4.2 \times 10^6$ $cm^{-2}$. The (0001)-oriented freestanding GaN substrate was placed on a quartz tray (susceptor) in a horizontal quartz reactor which normally operates under conditions of normal pressure. The pressure in the reactor was 100±2 kPa in all steps.

Step A (heating step) to step E were carried out in the same manner as in Example 3.

When the growth steps were finished, the substrate temperature was lowered and the gases in the reactor were completely replaced with $N_2$. Then, the substrate was taken out and evaluated.

The surface of the substrate thus fabricated had good flatness although there were very slight irregularities. The surface was measured with a contact-type surface roughness gage to determine center line average roughness (Ra) which is an index of irregularity. As a result, Ra according to the present reference example was 5.5 nm.

The sample according to the present reference example was subjected to SIMS analysis to determine distribution of Si concentration in the depth direction. As a result, the Si concentration in the second nitride semiconductor layer was $5 \times 10^{18}$ $cm^{-3}$, which conformed to a set value, but the Si concentration of a portion corresponding to the location of the first nitride semiconductor layer (with a thickness of 40 nm) had a peak of $3 \times 10^{19}$ $cm^{-3}$. It is considered that for some reason, Si segregated between the substrate and the first nitride semiconductor layer into which Si had not been introduced intentionally.

INDUSTRIAL APPLICABILITY

The present invention provides a crystal growth method for a high-quality nitride semiconductor characterized by good surface morphology and optical characteristics as well as high luminous efficiency when used as a light-emitting element.

The invention claimed is:

1. A nitride semiconductor crystal growth method for growing a crystal of a nitride semiconductor on a principal nitride plane of a base at least one principal plane of which is a nitride, the nitride semiconductor crystal growth method comprising:

heating said base for a period including a period $t_A$ during which the base is heated to a predetermined temperature with the principal nitride plane of the base exposed to an atmosphere containing ammonia gas, but not containing hydrogen gas;

a first growing step of epitaxially growing a first nitride semiconductor layer on the principal nitride plane of the base with the principal nitride plane of the base exposed to an atmosphere containing ammonia gas and without the intentional supply of a silicon source material; and a second growing step of epitaxially growing a second nitride semiconductor layer on the first nitride semiconductor layer while supplying an n-type dopant source material with the surface of the first nitride semiconductor layer exposed to an atmosphere containing ammonia gas, wherein the base is a freestanding substrate of GaN, AlN, InN, or BN or a mixed crystal thereof, the principal nitride plane of the base is a crystal plane within ±5 degrees inclusive from a (0001) c⁺-plane, the predetermined temperature, $T_A$, in the heating step is between 700° C. and 1,350° C. both inclusive, and an epitaxial growth temperature $T_{g1}$ of the first nitride semiconductor layer in the first growing step is between 700° C. and 1,350° C. both inclusive, and wherein a flow ratio of an inactive gas component to all constituent gases is between 0.5 and 1.0 both inclusive in the heating step, and a flow ratio of an active gas component to all constituent gases is between 0.5 and 1.0 both inclusive in the first growing step.

2. A nitride semiconductor crystal growth method for growing a crystal of a nitride semiconductor on a principal nitride plane of a base at least one principal plane of which is a nitride, the nitride semiconductor crystal growth method comprising:

heating said base for a period including a period $t_A$ during which the base is heated to a predetermined temperature in an atmosphere having a main flow containing ammonia gas, but not containing hydrogen gas;

a first growing step of epitaxially growing a first nitride semiconductor layer on the principal nitride plane of the base in an atmosphere having a main flow containing ammonia gas and without the intentional supply of a silicon source material; and a second growing step of epitaxially growing a second nitride semiconductor layer on the first nitride semiconductor layer while supplying an n-type dopant source material in an atmosphere having a main flow containing ammonia gas, wherein the base is a freestanding substrate of GaN, AlN, InN, or BN or a mixed crystal thereof, the principal nitride plane of the base is a crystal plane within ±5 degrees inclusive from a (0001) c⁺-plane, the predetermined temperature, $T_A$, in the heating step is between 700° C. and 1,350° C. both inclusive, and an epitaxial growth temperature $T_{g1}$ of the first nitride semiconductor layer in the first growing step is between 700° C. and 1,350° C. both inclusive, and wherein a flow ratio of an inactive gas component to all constituent gases is between 0.5 and 1.0 both inclusive in the heating step, and a flow ratio of an active gas component to all constituent gases is between 0.5 and 1.0 both inclusive in the first growing step.

3. The nitride semiconductor crystal growth method according to claim 2, wherein before the heating period $t_A$, the heating step has a period $t_B$ during which the base is heated in an atmosphere having a main flow containing a gas composition different from the main flow used during the heating period $t_A$.

4. The nitride semiconductor crystal growth method according to claim 2, wherein the main flow also contains an inactive gas during the heating period $t_A$, wherein the inactive gas is at least one gas selected from the group consisting of nitrogen (N2), helium (He), argon (Ar), xenon (Xe), krypton (Kr), a hydrazine compound, an amine compound, and an azide compound.

5. The nitride semiconductor crystal growth method according to claim 2, wherein: the main flow in the first and second growing steps includes at least a first main flow and a second main flow; the first main flow mainly supplies a nitrogen source material constituting the nitride semiconductor layers; and the second main flow mainly supplies source materials for elements other than nitrogen constituting the nitride semiconductor layers.

6. The nitride semiconductor crystal growth method according to claim 1, wherein the first growth step is carried out without thermally cleaning the principal nitride plane of the base after the heating step is finished.

7. The nitride semiconductor crystal growth method according to claim 2, wherein the first growth step is carried out without thermally cleaning the principal nitride plane of the base after the heating step is finished.

8. The nitride semiconductor crystal growth method according to claim 1, wherein the epitaxial growth temperature $T_{g1}$ of the first nitride semiconductor layer in the first growing step is between 750° C. and 1,350° C. both inclusive.

9. The nitride semiconductor crystal growth method according to claim 8, wherein the epitaxial growth temperature $T_{g1}$ of the first nitride semiconductor layer in the first growing step is between 900° C. and 1,350° C. both inclusive.

10. The nitride semiconductor crystal growth method according to claim 2, wherein the epitaxial growth temperature $T_{g1}$ of the first nitride semiconductor layer in the first growing step is between 750° C. and 1,350° C. inclusive.

11. The nitride semiconductor crystal growth method according to claim 10, wherein the epitaxial growth temperature $T_{g1}$ of the first nitride semiconductor layer in the first growing step is between 900° C. and 1,350° C. inclusive.

* * * * *